United States Patent [19]
Kohmoto et al.

[11] Patent Number: 5,481,136
[45] Date of Patent: Jan. 2, 1996

[54] SEMICONDUCTOR ELEMENT-MOUNTING COMPOSITE HEAT-SINK BASE

[75] Inventors: Kenichiro Kohmoto, Itami; Mitsuo Osada, Sakata, both of Japan

[73] Assignee: Sumitomo Electric Industries, Ltd., Osaka, Japan

[21] Appl. No.: 420,901

[22] Filed: Apr. 11, 1995

Related U.S. Application Data

[63] Continuation of Ser. No. 141,592, Oct. 27, 1993, abandoned.

[30] Foreign Application Priority Data

Oct. 28, 1992 [JP] Japan .................... 4-313968

[51] Int. Cl.[6] .......................... H01L 23/34; H01L 23/52
[52] U.S. Cl. .................. 257/712; 257/720; 257/747; 165/80.2; 361/708; 361/709; 361/717
[58] Field of Search ................. 257/712, 713, 257/720, 747; 165/80.2; 361/704, 708, 709, 717

[56] References Cited

U.S. PATENT DOCUMENTS

| | | | |
|---|---|---|---|
| 4,788,627 | 11/1988 | Ehlert et al. | 257/712 |
| 5,015,803 | 5/1991 | Mahulikar et al. | 257/703 |
| 5,111,277 | 5/1992 | Medeiros, III et al. | 257/720 |
| 5,113,315 | 5/1992 | Capp et al. | 257/712 |
| 5,188,985 | 2/1993 | Medeiros, III et al. | 257/711 |

*Primary Examiner*—Rolf Hille
*Assistant Examiner*—David Ostrowski
*Attorney, Agent, or Firm*—Wenderoth, Lind & Ponack

[57] ABSTRACT

A semiconductor-mounting heat-sink base for use with a plastic package or flexible printed wiring board which eliminates the possibility of semiconductor or package reliability being adversely affected due to a difference in thermal expansion coefficient between the heat sink base and the semiconductor or plastic package. The heat-sink base has a semiconductor-mounting portion comprising a Cu—W or Cu—Mo composite alloy containing 5 to 25 wt. % of copper made by an infiltration process, and a portion adjacent to a plastic package which comprises a copper or copper alloy containing not less than 95% of copper.

22 Claims, 18 Drawing Sheets

SEMICONDUCTOR ELEMENT-MOUNTING COMPOSITE HEAT-SINK BASE

This application is a continuation of now abandoned application Ser. No. 08/141,592, filed on Oct. 27, 1993, now abandoned.

BACKGROUND OF THE INVENTION

1. Field of the Invention

The present invention relates to a semiconductor-mounting composite heat-sink base having high heat dispersion characteristics and capable of being highly reliably bonded with a plastic package or flexible printed wiring board.

2. Description of the Prior Art

Recently, with improvements in the art of plastic packaging and/or flexible printed wiring, including higher density wiring, hermetic sealing, and faster response to signals, it has become possible to mount semiconductor devices of higher integration, faster performance, and larger capacity into units as LSI and IC packages. However, higher integration and faster operations involve increased heat generation from semiconductor elements, and this gives rise to an important problem that heat generated by the semiconductor elements be dispersed in order that the elements may normally operate.

Hitherto, as a solution to this problem, there has been proposed a plastic package or flexible printed wiring board of the type having a semiconductor mounting portion with a copper or copper alloy plate used as a heat sink. Typical examples of such arrangement are shown in section in FIGS. 10 and 11.

In FIGS. 10 and 11, numerals 19, 20 designate a copper or copper alloy-made base; 5 designates a multilayer plastic substrate formed of, for example, polyimide; 6 designates an Si semiconductor device mounted on the substrate 19, 20; and 21, 22, and 23 respectively designate a copper pin, a bonding wire, and a lid made of polyimide. The heat sink base 19 used in the package shown in FIG. 10 is of a flat plate configuration, and the heat sink base 20 used in the package shown in FIG. 11 is of a stepped configuration such that a semiconductor device-mounting portion is positioned higher so that the height of the semiconductor device 6 can be made even with the height of a terminal attachment portion of the multilayer plastic substrate 5, which provides an advantage over the FIG. 10 arrangement for purposes of semiconductor packaging.

With such packaging arrangement, the problem of heat dispersion can be solved. However, the fact that a semiconductor device has a thermal expansion coefficient of $4.2 \times 10^{-6}$ (deg$^{-1}$), whereas the thermal expansion coefficient of copper is $17 \times 10^{-6}$ (deg$^{-1}$), poses a problem that there is a substantial difference in thermal expansion between base 19, 20 and semiconductor device 6. As such, in either one of the two constructions shown there is a problem that bonding is adversely affected by thermal stress at an interface with respect to the semiconductor device mount, which will render the bonding unreliable.

In place of aforementioned copper and copper alloy, the use of a Cu—W or Cu—Mo composite alloy having lower thermal expansion characteristics and higher thermal conductivity has been considered. Typical constructions of plastic packages using a heat-sink base made of such a Cu—W or Cu—Mo composite alloy are schematically shown in section in FIGS. 12 and 13.

Use of such a construction has solved the problem of thermal expansion difference between Cu—W or Cu—Mo and a semiconductor device. However, a wire-breaking problem has come up to the fore with respect to fine copper wiring patterns. Therefore, in an attempt to prevent the breaking of fine copper wirings, it has been proposed to use a plastic substrate 5 having a thermal expansion coefficient of 13 to $17 \times 10^{-6}$ (deg$^{-1}$). In this case, however, there is still a problem such that cracking is likely to occur at a bonding interface between the substrate and the Cu—W or Cu—Mo composite heat-dispersion alloy 24, 25 due to a difference in thermal expansion therebetween, which is a problem from the standpoint of hermetic sealing.

As stated above, where a single material of copper or copper alloy, or of Cu—W or Cu—Mo composite ally is used as a heat-sink base for a plastic package or flexible printed wiring board, the problem is that the difference in thermal expansion involved will unfavorably affect the reliability of the semiconductor device or package as to the hermetic sealing thereof.

In order that this problem may be solved, it is necessary to equalize thermal expansion at a bonding interface. Thus, an idea has occurred that a composite material comprising copper or copper alloy and a Cu—W or Cu—Mo composite alloy bonded together be used as a heat-sink base for a plastic package or a flexible printed wiring board-mounting package.

Then, the advisability of using a heat-sink base comprising a copper plate and a Cu—W composite alloy joined by soldering, as shown in FIG. 14, was considered. To explain, by way of example, particulars studied, reference is had to FIG. 14 in which numeral 26 designates a Cu—W composite alloy of 20 mm×20 mm×1.0 mm having a copper content of 15 wt. %, 27 designates an oxygen-free copper plate of 30 mm×30 mm×1.2 mm, and 28 designates an Au—Sn eutectic solder of 20 mm×20 mm×0.05 mm having a melting point of 280° C.

The reason why an Au—Sn eutectic solder having a melting point of 280° C. is used is that since the temperature at which the heat-sink base is bonded with the plastic package or flexible printed wiring board is 260° C., the heat-sink base is required to resist a temperature of 260° C. or more. Further, it is intended that a residual stress, as well as distortion, due to the difference in thermal expansion between the copper plate (thermal expansion coefficient: $17 \times 10^{-6}$ (deg$^{-1}$)) and the Cu—W composite alloy (thermal expansion coefficient: $7 \times 10^{-6}$ (deg$^{-1}$) is minimized.

The Cu—W composite alloy plate 26 and oxygen-free copper plate 27, after Ni, Au plated, were placed in a reduction atmosphere at 300° C. and were joined together by Au—Sn eutectic soldering. Thus, a semiconductor-mounting composite heat-sink base having a stepped configuration as shown by 29 was obtained. In this case, however, the heat-sink base had, on surfaces shown by 30 and 31, a warpage of 0.2 mm to 20 mm due to a difference in thermal expansion between the copper plate and the Cu—W composite alloy despite the fact that joining was effected by using a low melting point solder. Such warpage hindered the work of assembling the heat-sink base into unity with a plastic package or flexible printed wiring board, and did not permit sufficient bonding of surface 30 with semiconductor elements mounted thereon, with the result that the heat-sink base suffered from considerable deterioration in its heat dispersion characteristics.

Another problem was that where a Cu—W or Cu—Mo composite alloy plate 32 is joined with a copper or copper alloy plate 33 via brazing filler material 34 as shown in FIG. 15, the area of surfaces bonded is so large that a gas produced from the brazing filler material or residual air in the bond interface will cause a defect to a bond layer on a composite base 35 as shown in section. Thus, the heat-sink base cannot provide any good heat dispersion characteristics.

Summary of the Invention

In order to ensure advantageous use of semiconductor-mounting heat-sink bases with plastic packages or flexible printed wiring boards, the present inventors conducted further research for the purpose of solving the above mentioned problems. As a result, the present invention has been developed.

The invention provides a composite heat-sink base of the following construction.

In a first aspect of the invention, there is provided a composite heat-sink base comprising a semiconductor device mounting portion which is formed of a Cu—W or Cu—Mo composite alloy made by an infiltration process and containing 5 to 25% by weight of copper, and a separate portion adjacent to a plastic package which is formed of a Cu—W or Cu—Mo composite alloy made by an infiltration process and containing 40 to 70% by weight of copper, the two composite alloy portions being integrally bonded together.

In its second aspect, the invention provides a composite heat-sink base which comprises a semiconductor device mounting portion formed of a Cu—W or Cu—Mo composite alloy containing 5 to 25% by weight of copper, and a separate portion adjacent to a plastic package which is formed of a copper material or copper alloy having a copper content of not less than 95%, the two portions being integrally bonded together.

For integral bonding, any method may be employed insofar as a bonding material which is soft and can well absorb thermal stress is used. In particular, various methods as enumerated below are considered as they are advantageous from the standpoints of productivity and quality reliability.

(a) For purposes of integrally bonding Cu—W or Cu—Mo composite alloys having different copper contents, mention may be made of a method which comprises preparing a porous sintered material of W or Mo and a composite porous sintered material of Cu and W or Cu and Mo, the porous sintered materials respectively having porosities sufficient to allow copper infiltration in respective desired amounts of copper, pre-molding the two porous sintered materials into required shapes, then setting them in an assembled form, infiltrating copper into pores of the respective porous sintered materials and, simultaneously therewith, forming a defect-free and rigidly bonded copper layer on a bond interface. In this case, by assembling the two materials together it is possible to obtain an assembly of a laminated flat plate configuration where the two materials are in the form of a flat plate. The bond interface is preferably flat but not limited to such configuration. The peripheral configuration of the heat-sink base may be varied in different ways. A plurality of thin sheets, laid one over another, may be integrally bonded together via a copper layer.

(b) For bonding a Cu—W or Cu—Mo portion and a copper or copper alloy portion together, brazing is employed. For the purpose of brazing, any brazing filler material may be used if a bond layer or brazed layer formed of the filler material can absorb thermal stress to a sufficient degree; can withstand any thermal stress involved in a subsequent surface treatment, such as plating, and when in actual use; has good heat dispersion characteristics; and can be held in rigid bond with bonded surfaces. In particular, use of a brazing filler material containing not less than 50 wt. % of silver and, for the rest, copper or copper and indium, provides good results.

(c) Another method for bonding a Cu—Mo portion and a copper or copper alloy portion together may be employed which comprises electrosintering a copper powder mass interposed between the two portions and, simultaneously therewith, bonding the two portions into integral unity. In this case, any material may be used as an interlayer bond insofar as it can exhibit such bond characteristics as described in item (b) above. More particularly, copper is effectively used in the present invention.

(d) A further method is available for bonding a Cu—W or Cu—Mo portion and a copper portion together, which comprises setting in a mold a porous sintered material of W or Mo, melting copper from a copper source, such as copper powder or copper plate, pouring molten copper into the mold to infiltrate copper into the porous sintered material to thereby form a Cu—W or Cu—Mo composite alloy, forming a copper portion simultaneously therewith according to a predetermined mold configuration, and bonding the two portions into a composite integral structure. In this case, too, various configurational combinations as noted in item (a) above may be used. Further, needless to say, the method provides a bond portion having such good characteristics as stated in item (b).

For the construction of the packaging base according to the invention, two different types, i.e., of a stepped configuration and of a flat plate configuration, in particular are considered as exemplified by the embodiments of the invention. More specifically, for the purpose of integrally joining a semiconductor-mounting portion having a thermal expansion coefficient approximate to that of the semiconductor device with a portion abutting the plastic package which has a thermal expansion coefficient approximate to that of the plastic package, one preferred arrangement is that the two portions, in the form of flat plates, are laid one over the other so that they are formed into a unitary member having a stepped configuration. Another preferred arrangement is that a center plate and an outer frame for receiving the center plate into a corresponding center space thereof, the two being of the same thickness, are assembled into a unitary member to provide a composite flat plate. These constructions are preferred from the standpoints of economy, productivity and quality reliability.

The composite heat-sink base may be used in both a plastic packaging portion and a flexible printed wiring board.

By virtue of the above described arrangement, the difference in thermal expansion coefficient between the heat-sink base and a semiconductor device, and that between the base and a plastic package can be reduced respectively at a portion of the base for a bond with the semiconductor device and at an adjacent portion of the base for bond with the plastic package. Thus, at the two bonding interfaces, the occurrence of heat cracks due to thermal stress can be prevented and higher bond strength can be obtained. A Cu—W or Cu—Mo composite alloy portion made by the infiltration technique essentially has a density ratio of 100% and, therefore, is surface pore-free, so that it provides good plate adhesion for a metallic deposit applied to the surface of the base at a bond portion.

The surface of the base does not permit any plating solution to penetrate thereinto and remain therein nor does it allow such solution to remain at an interface between the surface and the metallic deposit. This prevents the occurrence of any blister or peel of the metallic deposit which may otherwise arise with time due to the plating solution or gases produced therefrom. Further, by suitably selecting a bonding method in combination with composite factors (material and size) it is possible to inhibit after-bond warping due to residual thermal stress to a practically insignificant degree.

Therefore, sufficient bond strength can be had at each bond interface. This, coupled with the fact that the bond surface is not susceptible to cracking and other defects, enables the provision of a highly reliable composite heat-sink base having high hermetic sealing and good heat-dispersion characteristics. Further, the method of the invention enables bonding to be effected in a very easy manner and provides high productivity.

According to the invention, a Cu—W or Cu—Mo composite alloy with a Cu content of 5 to 25% which has high heat conductivity and, in particular, has lower-heat expansion characteristics suitable for the purpose of semiconductor mounting, and a Cu—W or Cu—Mo composite alloy with a Cu content of 40 to 70% which has higher-heat expansion characteristics suitable for the purpose of bonding with a plastic package or flexible multi-layer wiring board, are placed one over the other when they are in the state of W and Mo or Cu—W and Cu—Mo porous sintered materials, and simultaneously with infiltration of Cu into the sintered materials, they are bonded together, whereby a Cu—W or Cu—Mo alloy with its pores densely filled with Cu is formed which has a real density ratio of 100%. Thus, a semiconductor-mounting composite heat-sink base having a defect-free bond layer and good thermal conductivity, suitable for use with plastic packages, can be obtained.

One characteristic feature of a semiconductor-mounting composite base produced according to the invention is that since its bond layer is infiltrated with Cu in the same manner as in the process of infiltration wherein Cu is filled into a fine porous member by utilizing the phenomenon of capillarity, a defect-free Cu bond layer can be produced. This Cu bond layer relaxes thermal stress at a bond interface and is not susceptible to any such defect as warping which may hinder hermetic sealing and heat dispersion when the base is in use. Additionally, the adhesion strength of the bond layer is so high that, after bonding, the surface of the base can be machined without trouble.

Further, the Cu—W or Cu—Mo porous sintered material infiltrated with 40 to 70% Cu can be stamped in a complex fashion. So, the sintered material is stamped to provide a circular or square frame having a hollow center portion. Then, the center hollow portion is fitted with a W or Mo and Cu—Mo porous sintered material which is to be infiltrated with 5 to 25% Cu, and the two members are bonded together simultaneously with Cu infiltration. Thus, a flat plate-configured semiconductor-mounting composite heat-sink base can be obtained which comprises an outer peripheral portion made of a composite alloy with a Cu content of 40 to 70% and having a high thermal expansion coefficient, which portion is capable of being bonded with a plastic package, and a center portion made of a composite alloy having a low thermal expansion coefficient which is suitable for semiconductor mounting.

This flat plate-configured base can also be formed with a defect-free Cu bond layer by utilizing a capillary phenomenon similar to that in the above mentioned case, so that a heat-sink base having good thermal conductivity and high bond strength. Further, according to the invention, a Cu—W or Cu—Mo composite alloy with a copper content of 5 to 25 wt. % and a real density ratio of 100% and having high thermal conductivity and a low coefficient of thermal expansion is fitted in a hollow frame member made of a copper material or copper alloy with a copper purity of not less than 95% and having high thermal conductivity and a high coefficient of thermal expansion, and the two members are integrally bonded together. Thus, a semiconductor-mounting composite heat-sink base is obtained which has a defect-free bond layer, has good thermal dispersion characteristics, and is not susceptible to thermal stress and strain due to the difference in thermal expansion between a semiconductor device and a plastic package or flexible printed wiring board.

For the purpose of such bonding, an Ag—Cu based brazing filler material is used. It is preferable to use an Ag—Cu filler material containing not less than 50 wt. % of silver and, for the rest, copper or copper and indium. A Cu—W or Cu—Mo composite alloy is fitted in a hollow frame member made of a copper material or copper alloy having a copper purity of not less than 95%, by using such a brazing filler material, and then such Ag—Cu brazing filler material is infiltrated into the clearance between the two members by utilizing the phenomenon of capillarity, so that the two members are bonded together. Thus, a semiconductor-mounting composite heat-sink base having a defect-free bond layer can be obtained.

For the above described bonding, a brazing filler material of the Ag—Cu type containing not less than 50 wt. % of silver and, for the rest, copper or copper and indium is used because the filler material provides high bond strength, is highly reliable, has high thermal conductivity, and is not detrimental to semiconductor devices.

For bonding by electrosintering, a Cu—W or Cu—Mo composite alloy is set centrally in a graphite mold, and copper powder is loaded in a peripheral portion of the mold. The copper powder is electrosintered for being formed into a copper hollow frame and, simultaneously therewith, the composite alloy is integrally bonded with the hollow frame. Thus, a semiconductor-mounting composite heat-sink base is obtained.

This method of manufacture comprises pressing the Cu powder under vacuum, and applying voltage to develop microdischarge at powder particle-particle intervals. In this case, sintering progresses as plasma eliminates impurities on particle surfaces. Such discharge occurs also between such particles and the Cu—W or Cu—Mo composite alloy, and this provides an advantage that simultaneously when Cu powder is sintered, it is bonded with the composite alloy. As compared with the brazing method, therefore, this electrosintering method enables fabrication of composite heat-sink bases at lower cost, because solder is not required. Further, by varying the amount of Cu powder loading it is possible to selectively change the thickness of a copper hollow frame.

Further, there is a method of bonding by Cu casting. This method comprises setting centrally in a carbon mold a W or Mo porous sintered material designed so that after infiltration the sintered material will contain 5 to 25 wt. % of Cu, pouring molten copper into the mold in a hydrogen atmosphere under reduced pressure, infiltrating the W or Mo porous sintered material and, simultaneously therewith, forming a copper hollow frame, the two portions being integrally bonded together to form a semiconductor-mounting composite heat-sink base.

This method, as compared with the earlier described electrosintering method, is simpler in that a Cu hollow frame is formed simultaneously when a W or Mo porous sintered material is infiltrated with Cu, the two portions being integrally bonded together. Therefore, any working stage prior to the stage of Cu—W and/or Cu—Mo bonding may be omitted, so that composite heat-sink bases can be manufactured at lower cost. The method has another advantage that any Cu hollow frame of a complex shape can be inexpensively manufactured by employing a carbon mold worked to match the shape of the frame.

The copper content of the Cu—W or Cu—Mo composite alloy is set within the range of 5 to 25 wt. % because if the copper content is more than 25 wt. %, the difference in thermal expansion coefficient between the alloy and the material of a semiconductor device, such as Si or GaAs, becomes so great that thermal stress and strain will lower the heat dispersion and bond strength reliability of the heat-sink base at the interface between the base and the semiconductor device, and because if the copper content is less than 5 wt. %, the thermal conductivity of the alloy is so small that desired thermal dispersion characteristics cannot be obtained.

The reason why a Cu—W or Cu—M composite alloy, with a real density ratio of 100% resulting from infiltration is used is that when such a composite alloy is nickel-plated or nickel- and gold-plated for improvement of the wettability of brazing filler material or solder and for provision of corrosion resistance, plating solution may penetrate into pores present in the alloy surface, which may be a cause of discoloration or of metallic deposit blister and peel in a subsequent stage of heat-treatment.

A copper or copper alloy having a copper purity of not less than 95% is used because if the copper or copper alloy should contain more than 5% of another metal element or impurity element, the thermal conductivity of the copper or copper alloy would be lowered with the result that thermal dispersion characteristics cannot be obtained.

The semiconductor-mounting composite heat-sink base of the invention, in which a Cu—W or Cu—Mo composite alloy is fitted in and integrally bonded with a hollow frame made of a copper or copper alloy having a copper purity of not less than 95%, has the following characteristics with respect to after-bond residual stress and warpage.

The state of stress which occurs in a heat-sink base having a copper flat plate and a Cu—W or Cu—Mo composite alloy bonded together will be explained with reference to FIG. 16 which is a schematic view.

A copper plate 36 (thermal expansion coefficient: $17\times10^{-6}$ $(\deg^{-1})$) has a higher thermal expansion coefficient than Cu—W or Cu—Mo composite alloy. Therefore, a tensile residual stress 38 acts on the copper plate 36, while a compressive residual stress 39 acts on the Cu—W or Cu—Mo composite alloy 37. The two residual stresses act on the center axes of copper plate 36 and Cu—W or Cu—Mo composite alloy 37 respectively, and they tend to become balanced with each other. As a result, a bending moment, as shown at 40, occurs so that warping develops on surfaces 41 and 42 of the heat-sink base.

Next, the state of stress which occurs in a heat-sink base having a copper hollow frame 43 and a Cu—W or Cu—Mo composite alloy 44 bonded together by brazing will be explained with reference to FIG. 17(A) and 17(B) which are schematic sectional views.

In this case, too, a tensile residual stress 45 acts on the copper hollow frame 43 and a compressive residual stress 46 acts on the Cu—W or Cu—Mo composite alloy 44. However, these residual stresses are balanced because they are acting symmetrically relative to the central axis of the copper hollow frame and in parallel relation to each other. Thus, this heat-sink base has a characteristic feature that its surfaces 47 and 48 are not susceptible to warping.

Next, the state of residual stress which occurs with a composite heat-sink base of the invention as mounted to a plastic package or flexible printed wiring board will be explained.

For comparison, a heat-sink base 51 having a copper plate 49 and a Cu—W composite alloy bonded together by an Au—Sn eutectic solder having a melting point of 280° C., as mounted to a plastic package 5, is shown in schematic section in FIG. 18.

The heat sink base 51 and the plastic package 5 are both heated to 260° C. at a stage for their bonding. Therefore, when bonded, the heat-sink base 51 is found as bonded in such a condition that its warpage is almost eliminated. After bonding, however, warping occurs with the heat-sink base 51 and, in an area of its bond with the plastic package 5, a warpage of 12.5 kg/mm² maximum (a result of thermal stress analysis according to finite element method) is calculated as having occurred. This warpage exceeds an allowable bond strength limit of 5 kg/mm², resulting in degradation of hermetic sealing characteristics of the bond portion.

FIG. 19 shows in schematic section a heat-sink base 54 of the invention having a copper hollow frame 52 and a Cu—W or Cu—Mo composite alloy 53 bonded together by brazing, as mounted to a plastic package 5.

In this case, the heat-sink base 54 is not susceptible to warping after the process of bonding by brazing, as well as before and after plastic package bonding. Therefore, the maximum stress in the area of a bond between the base 54 and the plastic package 5 is 1.2 kg/mm² (a result of thermal stress analysis according to finite element method), which value is significantly lower than the allowable bond strength limit of 5 kg/mm² and insures good hermetic sealing reliability.

Where a Cu—W or Cu—Mo composite alloy having a Cu content of 5 to 25 wt. % and a Cu—W or Cu—Mo composite alloy having a Cu content of 40 to 70 wt. % are placed one over the other and bonded together, a similar effect can be obtained because the Cu bond layer relaxes thermal stress at the bond interface.

A semiconductor-mounting composite heat-sink base obtained by filler-material bonding in accordance with the invention has its characteristic features with respect to brazed layer quality, as described hereinbelow.

FIG. 20 shows a copper hollow frame and a Cu—W or Cu—Mo composite alloy as bonded by brazing according to the invention. In this case, the arrangement is such that brazing filler material 57 is poured into a clearance between the copper hollow frame 55 and the Cu—W or Cu—Mo composite alloy 56 for bonding them together. This permits utilization of a capillary phenomenon. Further, the area of bonding is rather small. Therefore, it is possible to obtain a composite base 58 having a defect-free brazing bond layer. Further, there is no possibility of the thermal dispersion performance of the heat-sink base being interfered with.

In the composite heat-sink base of the invention, by varying the composition of the Cu—W or Cu—Mo composite alloy and the inner diameter to outer diameter ratio of the copper hollow frame it is possible to change and control the thermal expansion coefficient of the joint (outer diametral portion) between the base and a plastic package. Where the thermal expansion coefficient of the plastic package (thermal expansion coefficient: 13—17×10$^{-6}$ deg$^{-1}$) is known, it is possible to predetermine the composition of the Cu—W or Cu—Mo composite alloy and the inner diameter to outer diameter ratio of the copper hollow frame within permissible design limits in such a way that they correspond with the thermal expansion coefficient of the plastic package. In addition, the composite heat-sink base of the invention can be made to have a stepped configuration without being subjected to machining. This provides for material savings with respect to Cu—W or Cu—Mo composite alloys and also savings in machining and tool costs.

BRIEF DESCRIPTION OF THE DRAWINGS

FIG. 29(A) is a sectional view of a composite heat-sink base according to an embodiment of the invention, and FIGS. 29(B) and 29(C) are sectional views of heat-sink bases representing comparison examples.

DETAILED DESCRIPTION OF THE PREFERRED EMBODIMENTS

Embodiments of the invention will now be described with reference to the accompanying drawings.

(Example 1)

Figure 21:
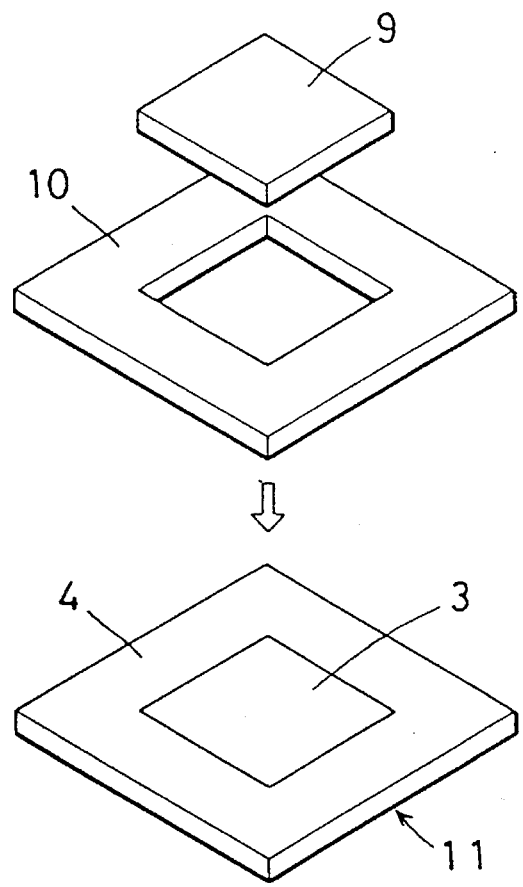
FIG. 21 is a flow diagram showing a process of manufacturing a composite heat-sink base according to an embodiment of the invention.

As FIG. 21 shows, a flat plate 9 used in a semiconductor device-mounting portion is a W powder sintered member or, more specifically, a porous sintered member which is sintered so that it will contain 15 wt. % of Cu when it is infiltrated with Cu. A square hollow frame 10 for use at a site of a bond with a flexible printed wiring board is a Cu—W powder sintered member or, more specifically, a porous sintered member which is sintered so that it will contain 50 wt. % of Cu when it is infiltrated with Cu. The flat plate 9 was made in the following sequence: a powder mixture including W powder and 2 wt. % of camphor added as an organic binder thereto was press molded into a shaped compact; the shaped compact was heated at 500° C. in a hydrogen atmosphere for camphor removal; and the compact was sintered at 1400° C. in a hydrogen atmosphere for 2 hours. The hollow frame 10 was made in the following sequence: W powder was premixed with 40 wt. % of Cu powder; 2 wt. % of camphor was added to the premix; the mixture powder was press-molded into a shaped compact; the compact was heated at 500 ° C. in a hydrogen atmosphere for camphor removal; and the compact was sintered at 900° C. in a hydrogen atmosphere for 2 hours.

11

The foregoing procedures resulted in a porous flat plate 9 of W having a dimensional configuration of 14.9 mm×14.9 mm×3.0 mm such that the plate would contain 15 wt. % of Cu when infiltrated with Cu, and a porous square hollow frame 10 of Cu—W having an outer dimension of 25 mm×25 mm, an inner dimension of 15.1 mm× 15.1 mm, and a thickness of 3.0 mm such that the frame would be infiltrated with 50 wt. % of Cu during the stage of Cu infiltration.

The flat plate 9 was fitted in the square hollow frame 10, and a Cu plate having a weight sufficient to fill both the porous members was placed on them. The assembly was heated to 1200° C. in a hydrogen atmosphere so that Cu was melted and infiltrated into pores of the porous members and, simultaneously therewith, the flat plate 9 and the frame 10 were bonded together. Thus, a composite alloy 11 of Cu and W was obtained which had a surface of 25 mm×25 mm×3.0 mm covered with Cu, an alloy portion 3 of Cu:W= 15:85 (weight ratio) representing the interior, and an alloy portion 4 of Cu:W=50:50 (weight ratio) representing the outer periphery.

Figure 22:
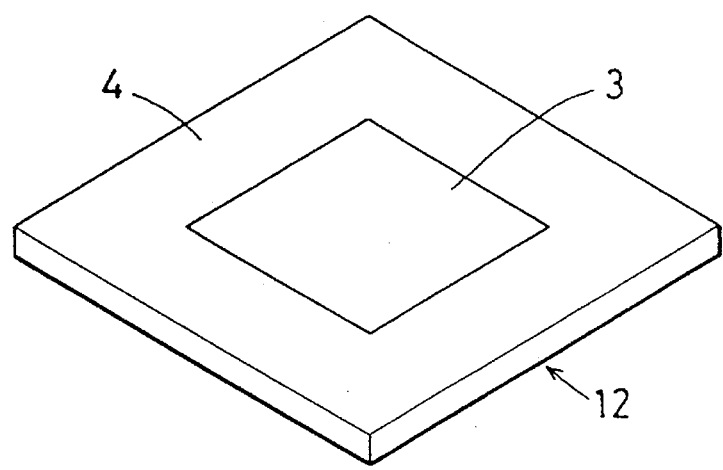
FIG. 22 is a perspective view of a composite heat-sink base according to an embodiment of the invention.
Figure 23A:
FIG. 23(A) is a sectional view of a composite heat-sink base according to the invention.
Figure 23B:
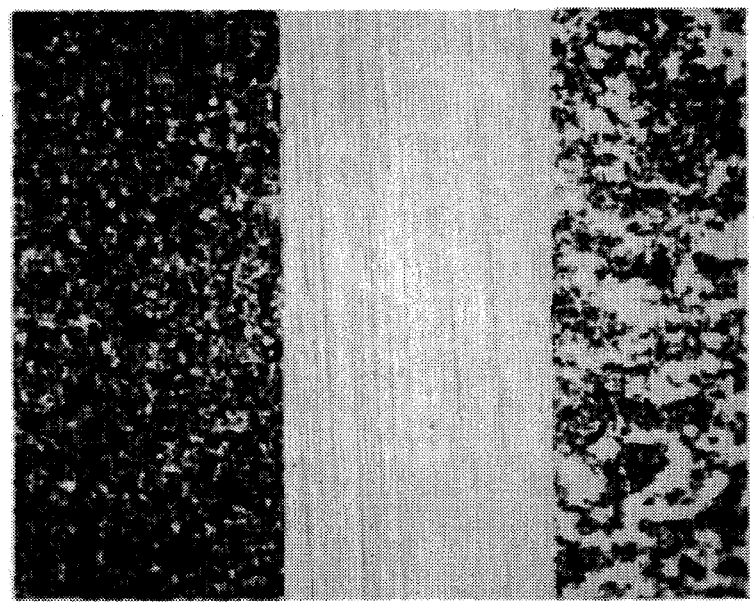
FIG. 23(B) is a microphotographic view in section showing a metallic texture of a bonded portion of the base.

This alloy 11 was ground on both sides thereof, and after the outer periphery thereof was worked, the alloy was plated with Ni and Au to give a composite heat-sink base 12 of flat plate configuration as shown in FIG. 22. A section of the base 12 is shown in FIG. 23 (A). A texture of a section of a bond portion as encircled with O was examined. As may be appreciated from a microscopic view given in FIG. 23 (B), defects such as pore cracks which would be detrimental to heat dispersion were not present at the bond portion.

Figure 24:
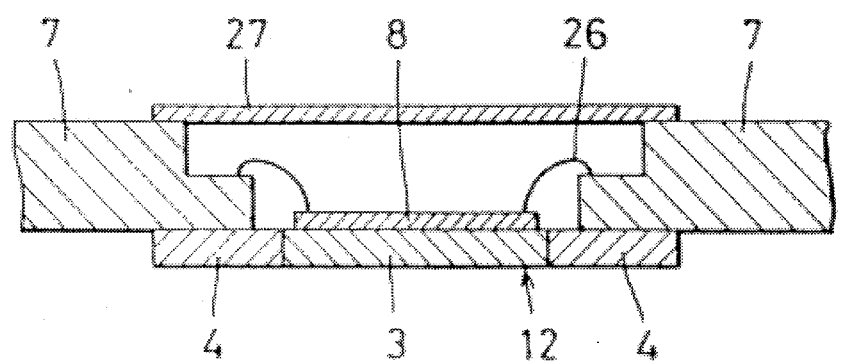
FIG. 24 is a schematic sectional view of a composite heat-sink base according to an embodiment of the invention as employed with a flexible printed wiring board.

The base 12 as applied in use is shown by way of example in FIG. 24. The outer periphery of the composite heat-sink base 12 represents the alloy portion 4 of Cu:W= 50:50 (weight ratio), whose thermal expansion coefficient is $12.7 \times 10^{-6}$ $(\deg^{-1})$. The interior of the base represents the alloy portion 3 of Cu:W=15:85 (weight ratio), whose thermal expansion coefficient is $7.0 \times 10^{-6}$ $(\deg^{-1})$.

Residual stress due to a difference in thermal expansion after bonding was compressive stress as in the case of a shrink fit. Since thermal expansion due to temperature rise will act toward releasing this compressive stress, the thermal expansion coefficient of the composite base 12 in its entirety (outer periphery) was $12.7 \times 10^{-6}$ $(\deg^{-1})$ which coincided with the thermal expansion coefficient of the alloy of Cu:W= 50:50 (weight ratio).

The thermal expansion coefficient of the flexible printed wiring board 7 was $13—17 \times 10^{-6}$ $(\deg^{-1})$ was little different than that of the outer periphery of the base 12. Therefore, the hermetic sealing performance of the resin bond between the two was not liable to be unfavorably affected. The internal portion or the semiconductor device-mounting portion is an alloy portion of Cu:W=15:85 (weight ratio), whose thermal expansion coefficient is $7.0 \times 10^{-6}$ $(\deg^{-1})$. The thermal expansion coefficient of a semiconductor silicon device 8 was $4.2 \times 10^{-6}$ $(\deg^{-1})$. Therefore, the difference in thermal expansion coefficient was insignificant, and no detrimental effect was observed on device reliability and package hermetic sealing.

(Example 2)

Figure 25:
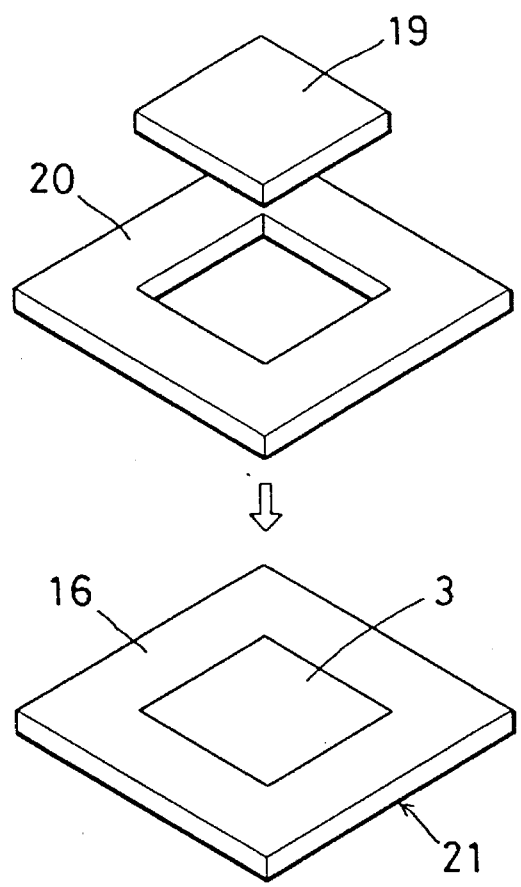
FIG. 25 is a flow diagram showing a process of manufacturing a composite heat-sink base according to an embodiment of the invention.

As FIG. 25 shows, a flat plate 19 used in a semiconductor device-mounting portion is a porous sintered member which is sintered so that it will contain 15 wt. % of Cu when it is infiltrated with Cu. A square hollow frame 20 for use at a site of a bond with a plastic package is a Cu—Mo powder sintered member or, more specifically, a porous sintered member which is sintered so that it will contain 40 wt. % of Cu when it is infiltrated with Cu. The flat plate 19, as a porous sintered member, was made in the same way as in Example 1. The hollow frame 20 was made in the following sequence: Mo powder was premixed with 30 wt. % of Cu powder; 2 wt. % of camphor, as a binder, was added to the premix; the mixture powder was press-molded; the camphor was removed in hydrogen; and the compact was sintered at 900° C. in a hydrogen atmosphere for 2 hours.

The foregoing procedures resulted in a porous flat plate 19 of W having a dimensional configuration of 14.9 mm×14.9 mm×3.0 mm such that the plate would contain 15 wt. % of Cu when infiltrated with Cu, and a porous square hollow frame 20 of Cu—Mo having an outer dimension of 25 mm×25 mm, an inner dimension of 15.1 mm× 15.1 mm, and a thickness of 3.0 mm such that the frame would be infiltrated with 40 wt. % of Cu during the stage of Cu infiltration.

Figure 26:
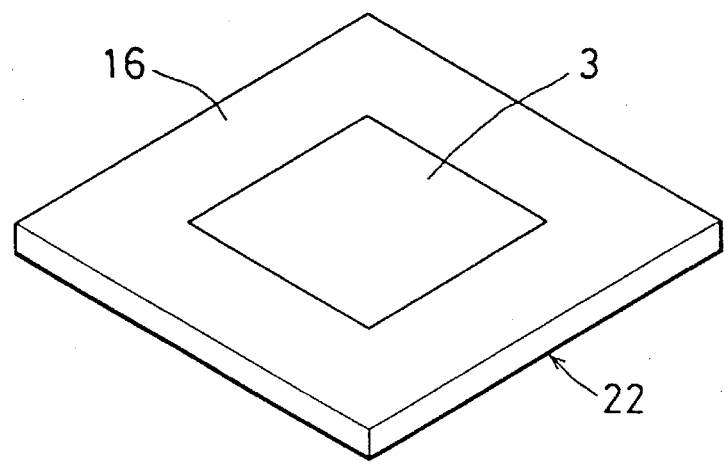
FIG. 26 is a perspective view of a composite heat-sink base according to an embodiment of the invention.

The flat plate 19 was fitted in the square hollow frame 20, and a Cu plate having a weight sufficient to fill both the porous members was placed on them. The assembly was heated to 1200° C. in a hydrogen atmosphere so that Cu was melted and infiltrated into pores of the porous members and, simultaneously therewith, the flat plate 19 and the frame 20 were bonded together. Thus, a composite alloy 21 of Cu, W and Mo was obtained which had a surface having an outer dimension of 25 mm×25 mm×3.0 mm covered with Cu, an alloy portion 3 of Cu:W=15:85 (weight ratio) representing the interior, and an alloy portion 16 of Cu:Mo= 40:60 (weight ratio) representing the outer periphery. This alloy 21 was ground on both sides thereof, and after the outer periphery thereof was worked, the alloy was plated with Ni and Au to give a composite heat-sink base 22 of flat plate configuration as shown in FIG. 26.

Figure 27A:
FIG. 27(A) is a sectional view of a composite heat-sink base according to an embodiment of the invention.
Figure 27B:
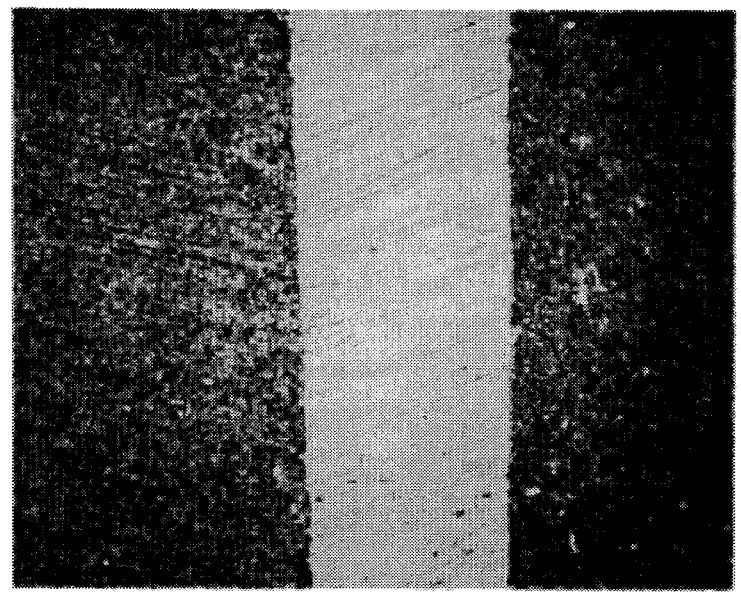
FIG. 27(B) is a microphotographic view in section showing a metallic texture of a bonded portion of the base.

A texture of a section of a bond portion as encircled with O in FIG. 27 (A) which shows a section of the base 22 was examined. As may be appreciated from a microscopic view given in FIG. 27 (B), defects such as pore cracks which would be detrimental to heat dispersion were not present at the bond portion.

Figure 28:
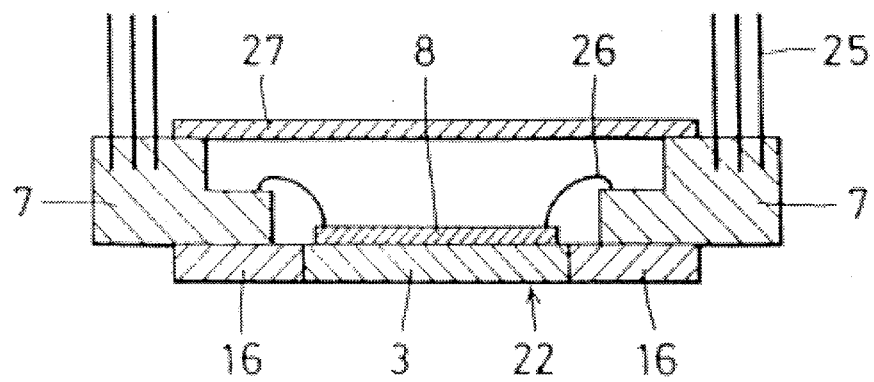
FIG. 28 is a schematic sectional view of a composite heat-sink base according to an embodiment of the invention as employed in a semiconductor-mounting plastic package.

The base 22 as applied in use is shown by way of example in FIG. 28. The outer periphery of the composite heat-sink base 22 represents the alloy portion 16 of Cu:Mo= 40:60 (weight ratio), whose thermal expansion coefficient is $12 \times 10^{-6}$ $(\deg^{-1})$. The interior of the base represents the alloy portion 3 of Cu:W=15:85 (weight ratio), whose thermal expansion coefficient is $7.0 \times 10^{-6}$ $(\deg^{-1})$.

Residual stress due to a difference in thermal expansion after bonding was compressive stress as in the case of a shrink fit. Since thermal expansion due to temperature rise will act toward releasing this compressive stress, the thermal expansion coefficient of the composite base 22 in its entirety (outer periphery) was $12 \times 10^{-6}$ $(\deg^{-1})$ which coincided with the thermal expansion coefficient of the alloy of Cu:W= 40:60 (weight ratio).

The thermal expansion coefficient of the plastic package 7 was $13—17 \times 10^{-6}$ $(\deg^{-1})$ which was little different than that of the outer periphery of the base 22. Therefore, the hermetic sealing performance of the resin bond between the two was not liable to be unfavorably affected. The internal portion or the semiconductor device-mounting portion is an alloy portion of Cu:W=15:85 (weight ratio), whose thermal expansion coefficient is $7.0 \times 10^{-6}$ $(\deg^{-1})$. The thermal expansion coefficient of a semiconductor silicon device 8 was $4.2 \times 10^{-6}$ $(\deg^{-1})$. Therefore, the difference in thermal expansion coefficient was insignificant, and no detrimental effect was observed on device reliability and package hermetic sealing.

(Example 3)

Figure 1:
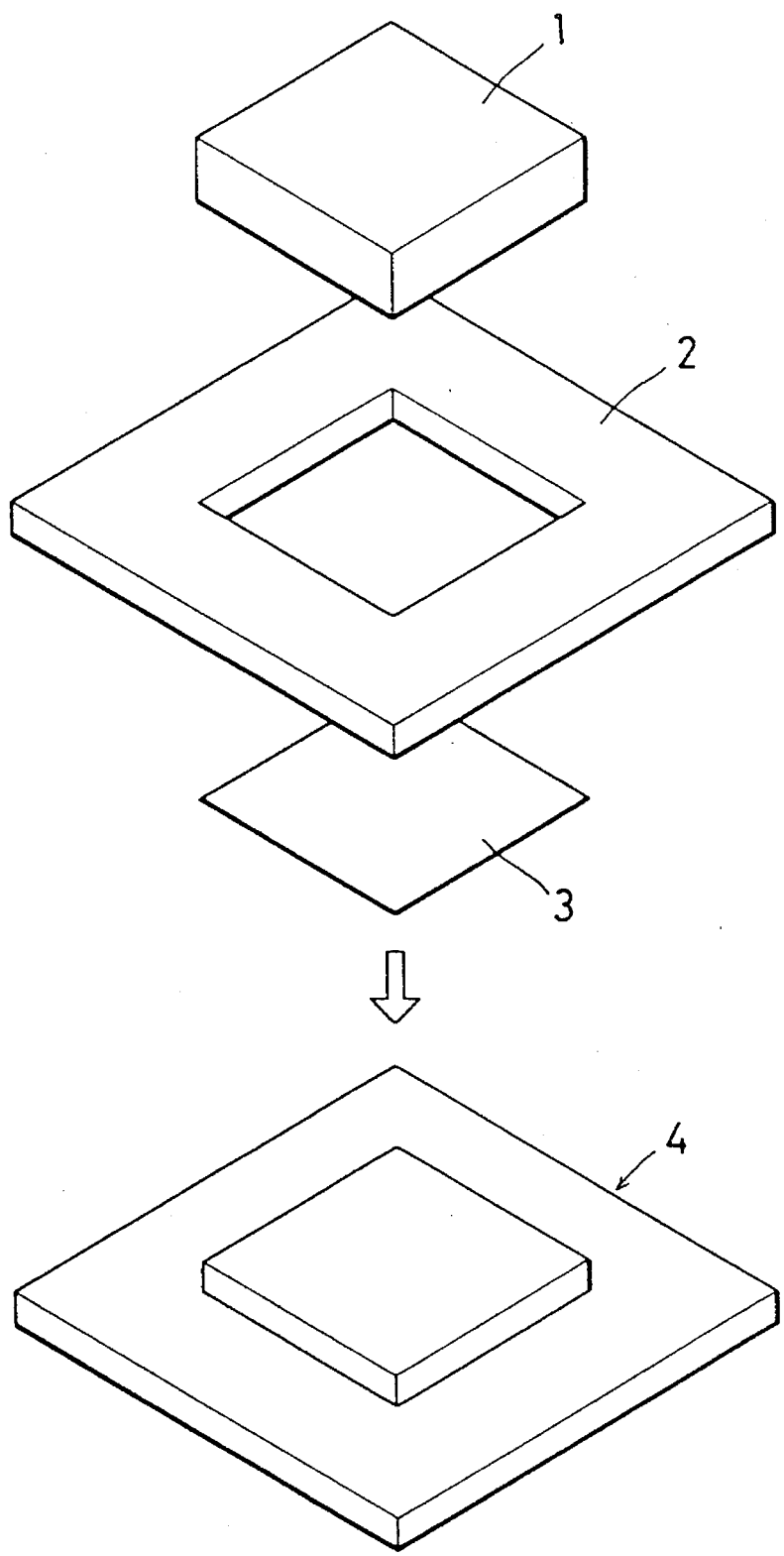
FIG. 1 is a flow diagram showing a process of manufacturing a composite heat-sink base according to the present invention.

In FIG. 1. a flat plate 1 for use as a semiconductor-mounting portion is a Cu—W alloy containing 15 wt. % of Cu. A hollow frame 2 for use at a site for a bond with a plastic package is an oxygen-free copper plate. The flat plate 1 was fabricated in the following way. A mixture powder including W powder and 2 wt. % of camphor added as an organic binder thereto was loaded into a mold, then pressed into a shaped compact. The shaped compact was heated at 500° C. in a hydrogen atmosphere for camphor removal, and the compact was sintered at 1400° C. in a hydrogen atmosphere for 2 hours. Thus, a porous member of W was obtained.

Nextly, on this porous member was placed a copper plate having a weight sufficient to fill pores of the porous member, which was heated to 1200 ° C. so that the copper was melted and infiltrated into pores of the porous member. Thus, a Cu—W composite alloy of 16 mm×16 mm×3.0 mm having a copper content of 15 wt. % whose surface was covered with copper was obtained. The composite alloy was ground on both sides and its outer peripheral edges were machined to thereby remove surface copper. Thus, a flat plate 1 of 15 mm×15 mm×2.5 mm was obtained. The flat plate 1 was plated with 0.2 to 0.8 μm Ni for improvement of wettability with a brazing filler material 3.

The hollow frame 2 of oxygen-free copper was obtained in the following way. A hoop of oxygen-free copper having a dimensional size of 1000 mm long×30 mm wide×1 mm thick was stamped out and the same was introduced into a mold in which the stamped material was molded into a frame having an outer diameter of 22 mm×22 mm, an inner diameter of 15.1 mm×15.1 mm, and a thickness of 1 mm. Then, on a carbon jig, the flat plate 1 was fitted in the hollow frame 2. Under the two members were placed an Ag—Cu eutectic brazing filler material 3 of such quantity as to fill the clearance between the flat plate 1 and the hollow frame 2 at their bond site. The assembly was heated to 800° C. in a hydrogen atmosphere so that the brazing filler material 3 was melted and infiltrated into the clearance at the bond portion through utilization of a capillary phenomenon, whereby the two members were bonded together. Thus, a composite heat-sink base 4 as shown in FIG. 1 was produced.

A microscopic observation of the microstructure within the texture of the bond portion of the base shows that there was no crack or pore which may hinder thermal dispersion. Measurement results as to warpage of samples are shown in Table 1. For comparison, a Cu—W composite alloy (copper content: 15 wt. %) of 22 mm×22 mm×1.5 mm and an oxygen-free copper plate of 22 mm×22 mm×1.0 mm were placed over the other, and they were bonded together by using Au—Sn eutectic brazing filler material (melting point: 280° C.) and an Ag—Cu eutectic brazing filler material (melting point: 780° ). Measurement results as to warping in this case are also shown. FIG. 29 shows sections of the invention (A) and comparison examples (B) and (C).

TABLE 1

(Warpage Measurement Results)

| No. | (A) W-15/Cu frame (Ag-Cu Filler) | (B) W-15/Cu plate (Au-Sn Filler) | (C) W-15/Cu plate (Ag-Cu Filler) |
|---|---|---|---|
| 1 | 0.003 (mm) | 0.141 (mm) | 0.195 (mm) |
| 2 | 0.005 (mm) | 0.140 (mm) | 0.191 (mm) |
| 3 | 0.014 (mm) | 0.137 (mm) | 0.198 (mm) |
| 4 | 0.003 (mm) | 0.129 (mm) | 0.196 (mm) |
| 5 | 0.004 (mm) | 0.128 (mm) | 0.192 (mm) |
| 6 | 0.007 (mm) | 0.135 (mm) | 0.197 (mm) |
| Aver. | 0.006 (mm) | 0.135 (mm) | 0.195 (mm) |

According to Table 1, warpage of the heat-sink base of the invention is less than 0.02 mm which is within an allowable range in which heat-dispersion and hermetic seal qualities are not affected in bonding the heat-sink base with semiconductor devices and plastic packages. (Heat-sink base warpage standard: less than 0.05 mm)

Figure 3:
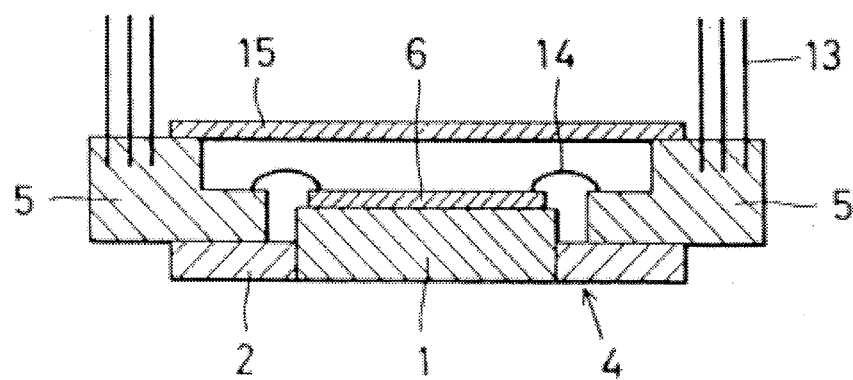
FIG. 3 is a schematic sectional view of a semiconductor mounting plastic package using the composite heat-sink base of the invention.

The base 4 as applied in use is shown by way of example in FIG. 3. The thermal expansion coefficient of the composite base 4 on its outer periphery was measured at $12.5 \times 10^{-6}$ ($deg^{-1}$) which was about even with that of the plastic package 5. Therefore, the hermetic seal of the bond between the two was not affected in any detrimental way. The thermal expansion coefficient of the semiconductor-mounting portion or Cu—W composite alloy 1 was $7.0 \times 10^{-6}$ ($deg^{-1}$), and that of the semiconductor device 6 was $4.2 \times 10^{-6}$ ($deg^{-1}$). Thus, the difference in thermal expansion coefficient was insignificant, and device reliability was not affected in any way.

(Example 4)

Next, the method of manufacturing a Cu—W/Cu composite heat-sink base will be explained with respect to the electrosintering process with a mounting configuration taken into consideration.

Figure 4:
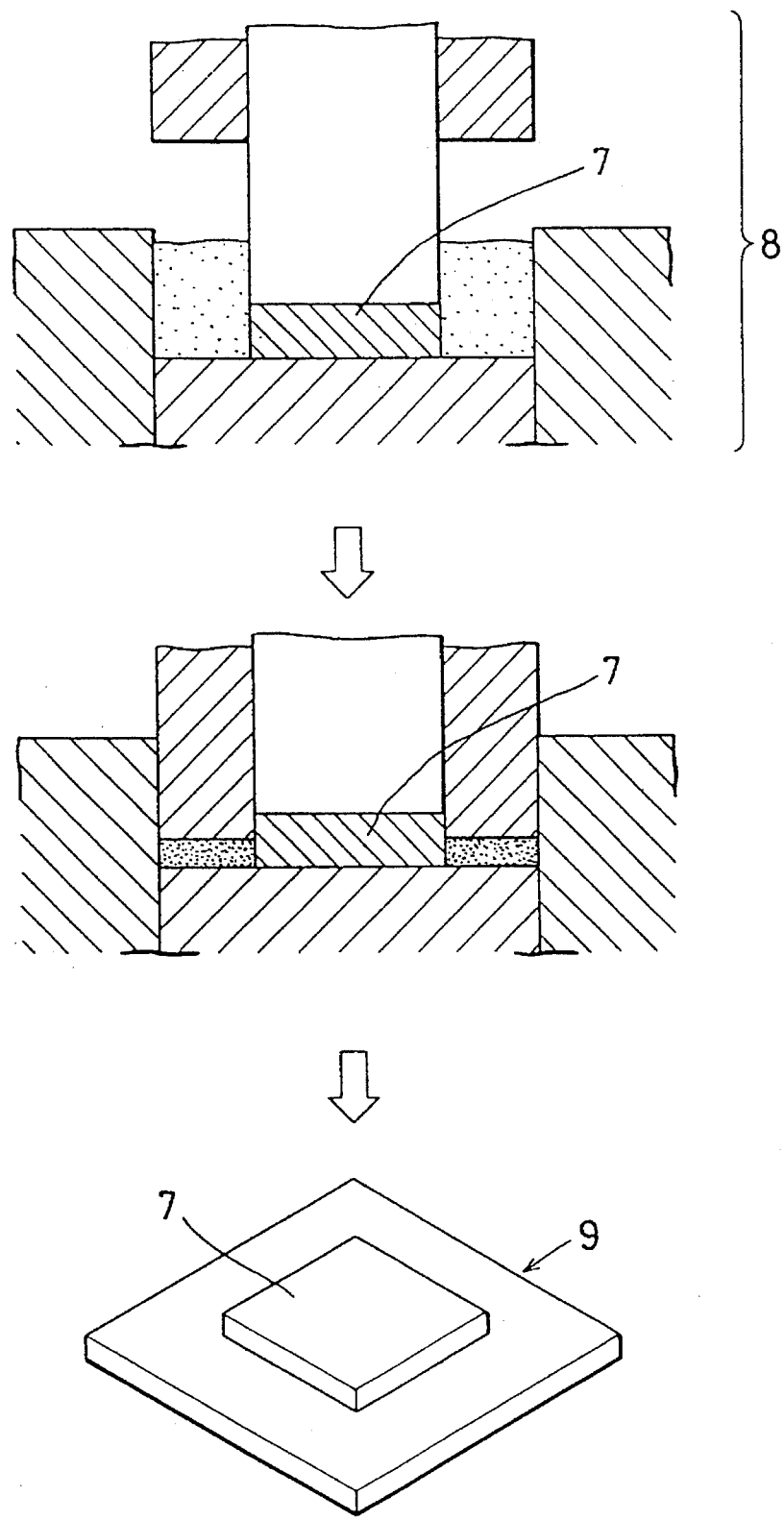
FIG. 4 is a flow diagram showing a process of manufacturing a composite heat-sink base according to the invention.

In FIG. 4, a flat plate 7 for use as a semiconductor-mounting portion is a Cu—W alloy containing 10 wt. % of Cu. A flat plate 7 of 15 mm×15 mm×2.5 mm was obtained in the same way as in Example 1. This flat plate 7 was set in the center of a carbon mold 8, and Cu powder is filled in a space of the mold surrounding an outer peripheral portion of the flat plate 7. After the sintering atmosphere was set to a vacuum of $10^{-3}$ mmHg, the interior of the mold was pressurized to 300 kg/cm² and, simultaneously therewith, voltage was applied, whereby a Cu hollow frame was formed and, simultaneously therewith, the frame was bonded with the plate 7. Thus, a composite heat-sink base 9 having a stepped configuration was obtained.

Figure 5A:
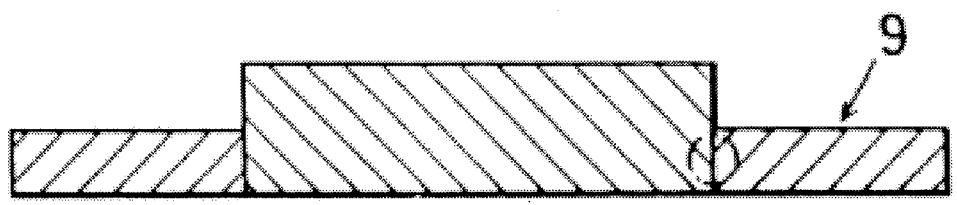
FIG. 5(A) is a sectional view of the composite heat-sink base of the invention.
Figure 5B:
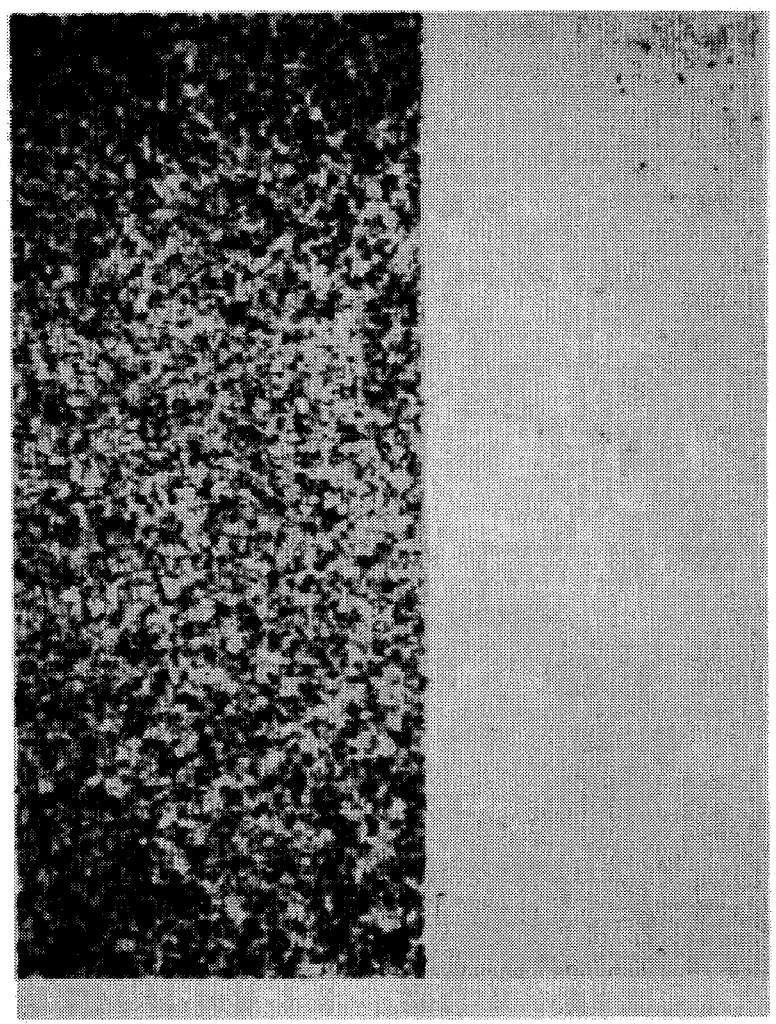
FIG. 5(B) is a microphotographic representation showing in section a metallic texture of a bonded portion thereof.

A microscopic observation of the microstructure within a section of the texture of the bond portion showed that, as FIG. 5 shows, there was present no such pore or defect as might affect the thermal dispersion and bond strength characteristics of the bond.

(Example 5)

Next, the method of making a Cu—W/Cu composite heat-sink base having a stepped configuration in accordance with the invention will be explained.

Figure 6:
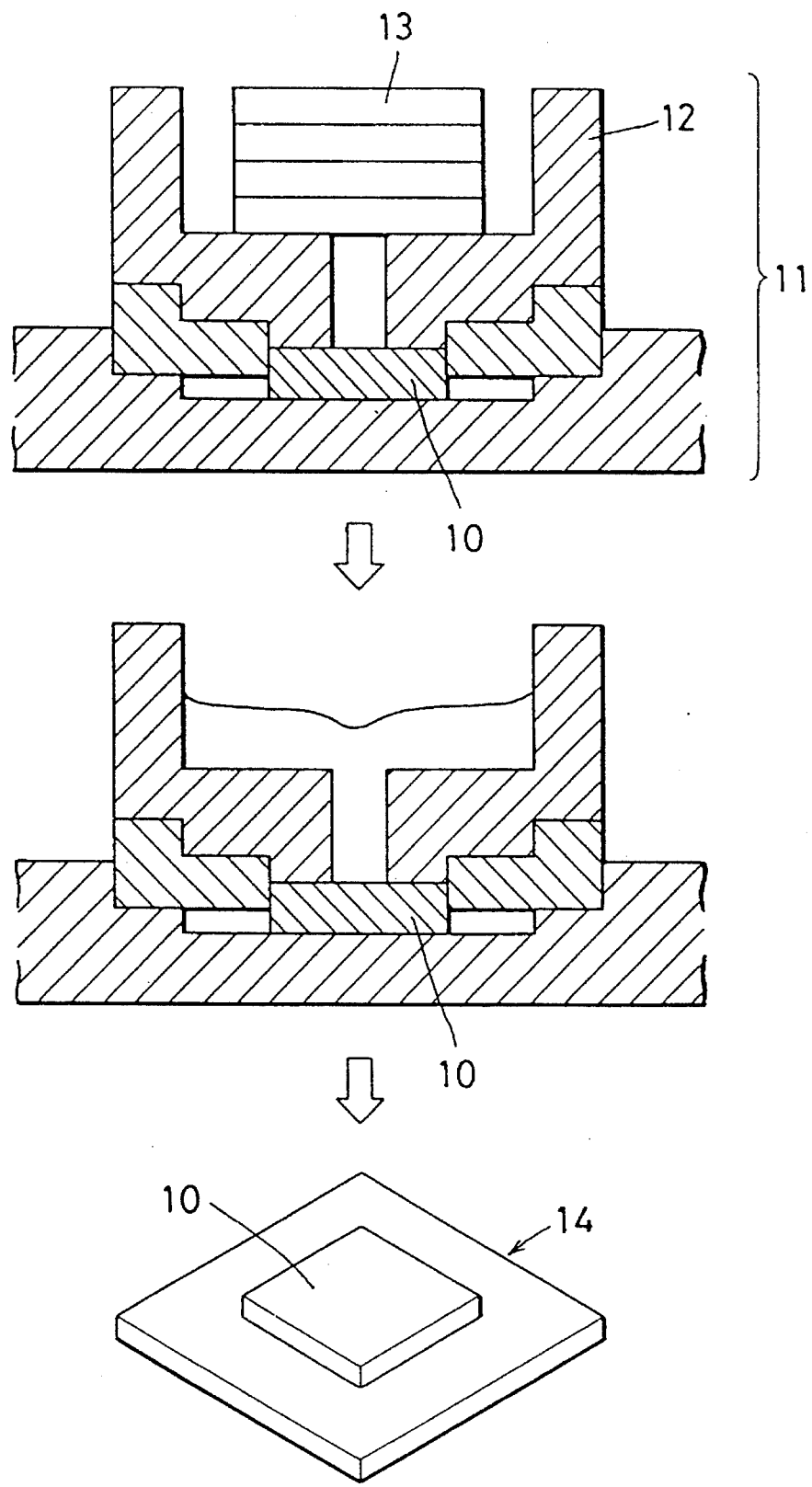
FIG. 6 is a flow diagram showing a process of manufacturing a composite heat-sink base according to the invention.

In FIG. 6, a flat plate 10 for use as a semiconductor-mounting portion is a porous sintered member of W which is sintered so that the flat plate will contain 10 wt % of Cu after the stage of infiltration. A porous sintered flat plate 10 of W having a size of 16 mm×16 mm× 3 mm was obtained in the same way as in Example 1.

Figure 7A:
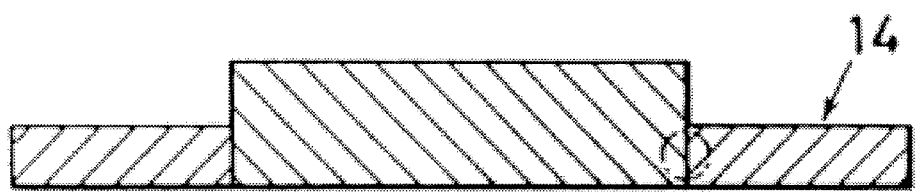
FIG. 7(A) is a sectional view of the composite heat-sink base of the invention.
Figure 7B:
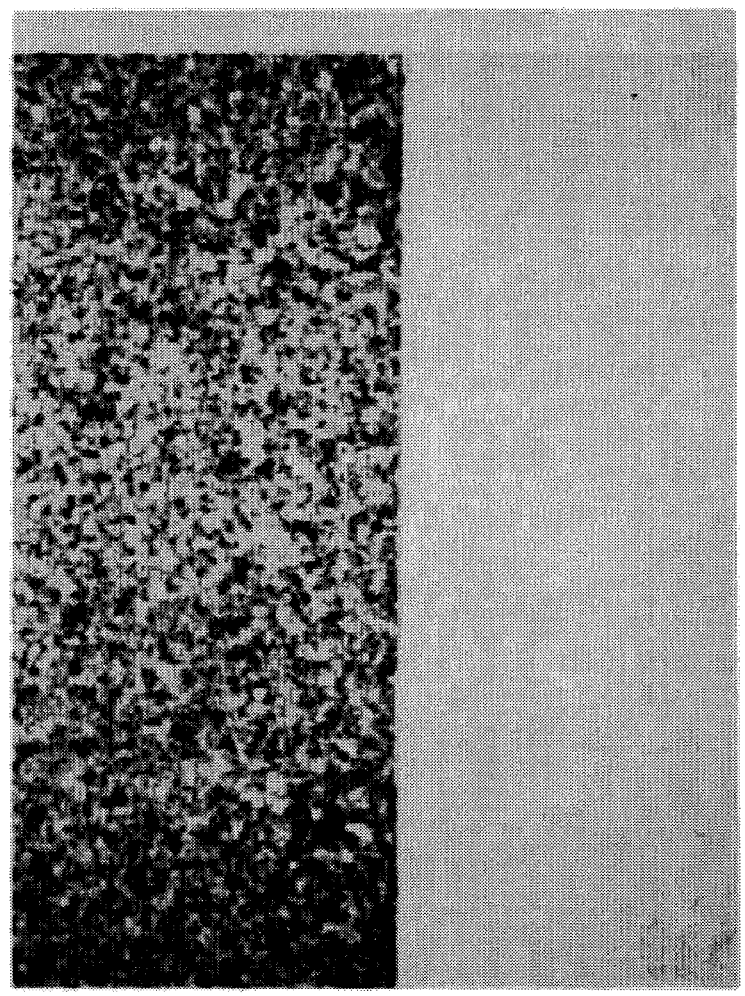
FIG. 7(B) is a microphotographic representation showing in section a metallic texture of a bonded portion thereof.

This flat plate was set in a center portion of a carbon jig 11, and a presser portion 12 and a copper plate were packed in position. The copper quantity of the copper plate was such that after infiltration of the W porous sintered member and further after a hollow plate being formed, there would still be some surplus. This set was introduced into a reduced pressure hydrogen sintering furnace, and the pressure in the hydrogen atmosphere was reduced to 0.04 mmHg. This condition was maintained at 1200° C. for 2 hours, whereby Cu was melted and infiltrated into pores of the W porous sintered member in the carbon jig and, simultaneously therewith, a hollow frame of Cu was formed. The objects were cooled and then removed from the furnace. Excess copper present on the flat plate 10 was ground away. Thus, a CuW/Cu composite heat-sink substrate having a stepped configuration was obtained. A microscopic observation of the texture of the microstructure within a section of of the bond portion showed that, as FIG. 7 shows, there was present no such pore as might obstruct thermal dispersion.

(Example 6)

Next, an example of the method of manufacturing a Cu—W/Cu composite heat-sink base having a flat plate configuration will be explained.

Figure 2A:
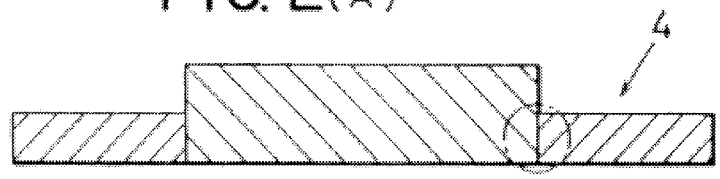
FIG. 2(A) is a sectional view of the composite heat-sink base of the invention.
Figure 2B:
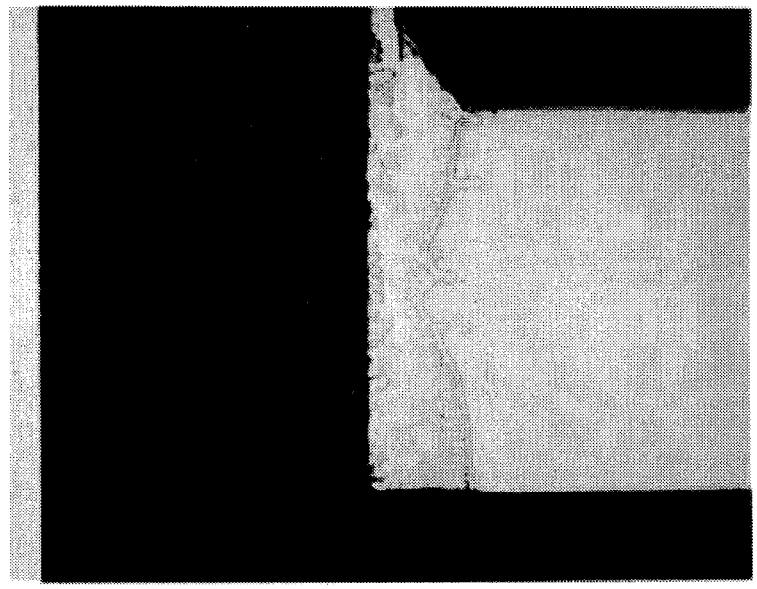
FIG. 2(B) is a microphotographic representation showing in section a metallic texture of a bonded portion thereof.
Figure 8:
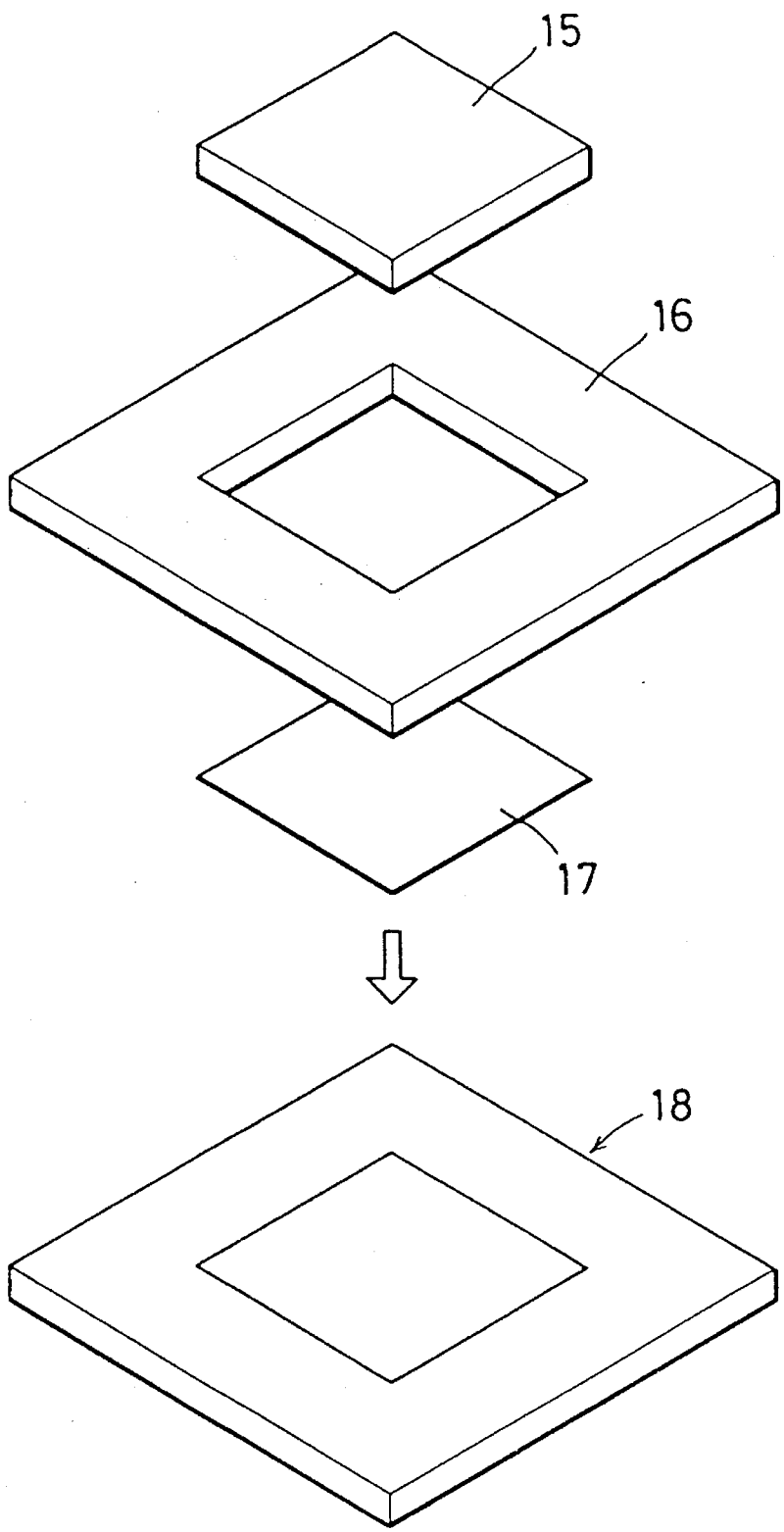
FIG. 8 is a flow diagram showing a process of manufacturing a composite heat sink base according to the invention.

In FIG. 8, a flat plate 15 for use as a semiconductor mounting portion is a Cu—W composite alloy containing 10 to 20 wt. % of copper. A hollow frame 16 for use at a site for a bond with a plastic package is an oxygen-free copper plate. In the same way as in Example 3, a Cu—W composite alloy of 16 mm×16 mm×2.0 mm having a copper content of 10 to 20 wt. %, and a hollow frame of an oxygen-free copper having an outer diameter of 21 to 38 mm, an inner diameter of 16.1 mm×16.1 mm, and a thickness of 2.0 mm, as shown in FIG. 2, were fabricated. These objects were brazed in the same way as in Example 3, whereby a composite heat-sink base 18 having a flat plate configuration was obtained. Measurement results with respect to thermal expansion coefficients of the outer diameter portion and Cu—W composite alloy of the composite base are shown in Table 2.

Figure 9:
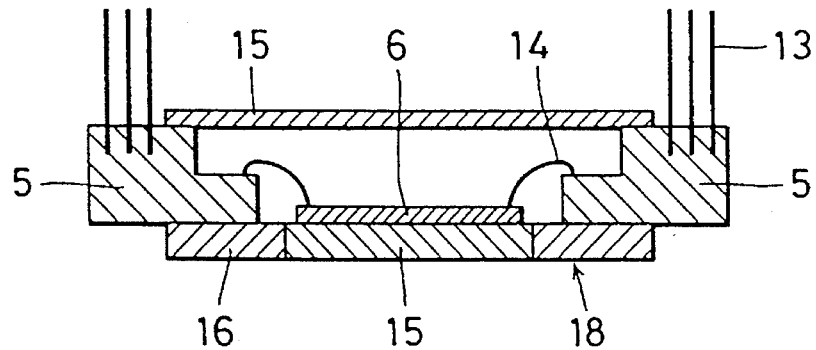
FIG. 9 is a schematic sectional view of a semiconductor mounting plastic package using a composite heat-sink base of the invention.
Figure 10:
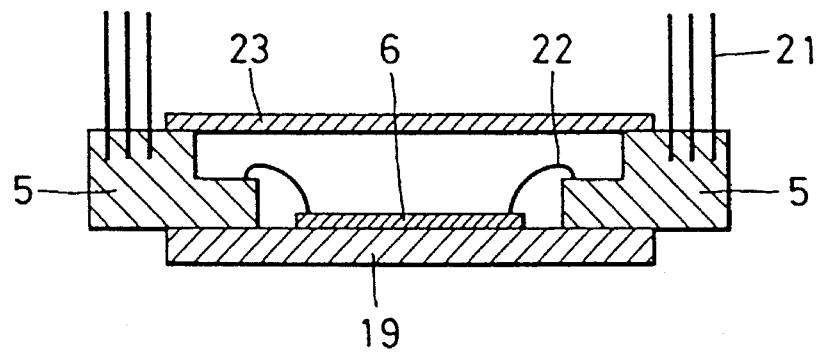
FIG. 10 is a schematic sectional view of a semiconductor mounting plastic package using a prior art heat-sink base.
Figure 11:
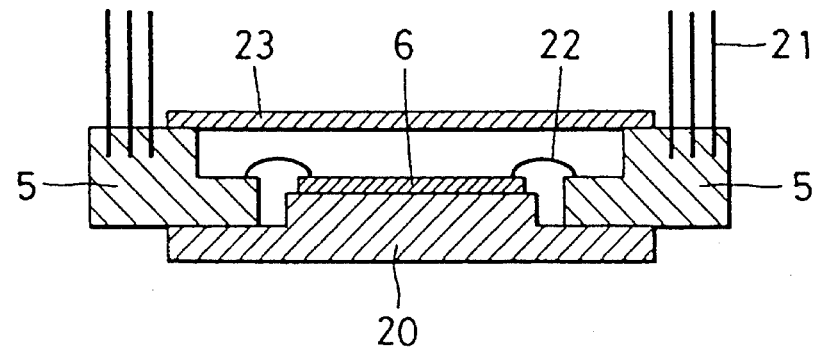
FIG. 11 is a schematic sectional view of a semiconductor mounting plastic package using a prior art heat-sink base.
Figure 12:
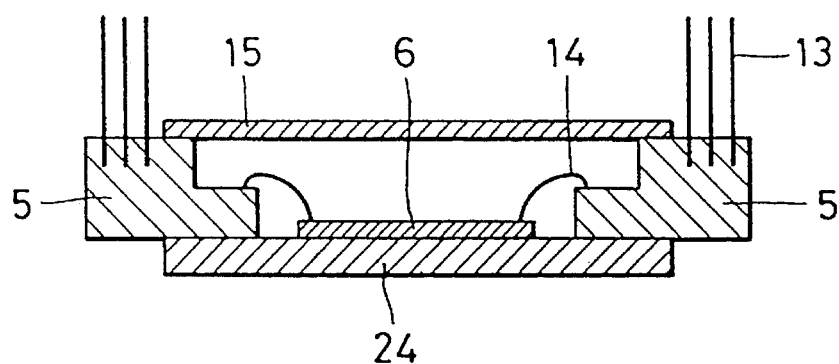
FIG. 12 is a schematic sectional view of a semiconductor mounting plastic package using a prior art heat-sink base.
Figure 13:
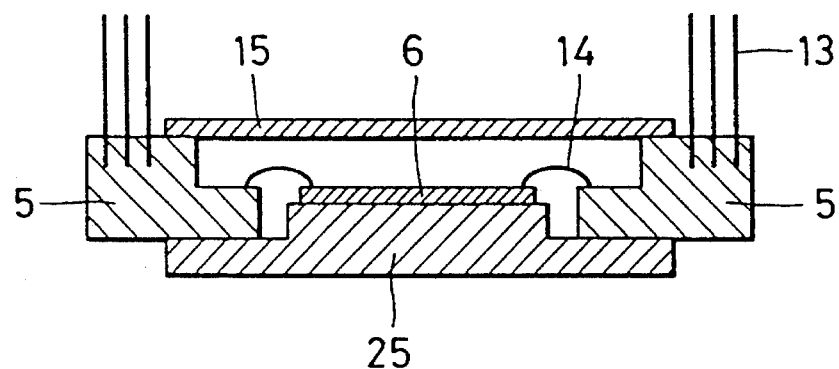
FIG. 13 is a schematic sectional view of a semiconductor mounting plastic package using a prior art heat-sink base.
Figure 14A:
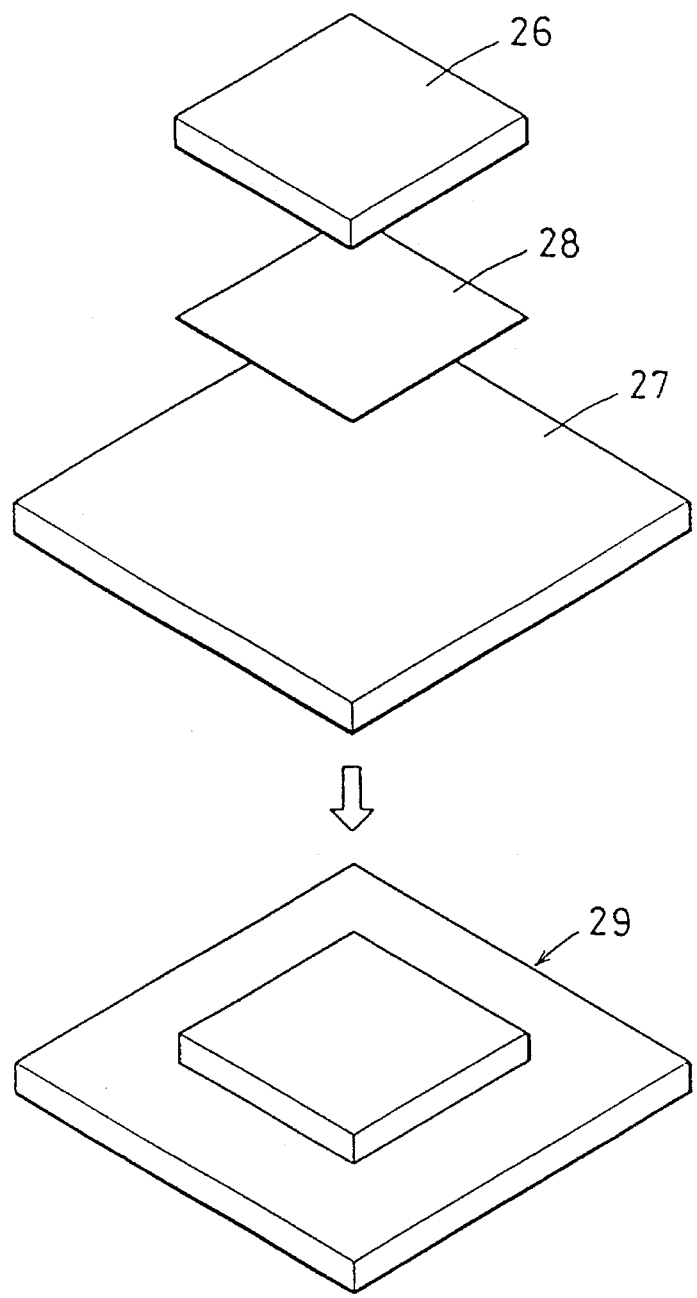
FIG. 14(A) is a flow diagram showing a process of manufacturing a prior art heat-sink base.
Figure 14B:
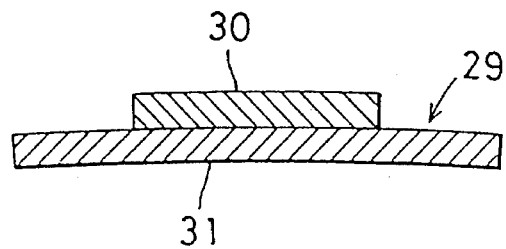
FIG. 14(B) is a sectional view of the base.
Figure 15A:
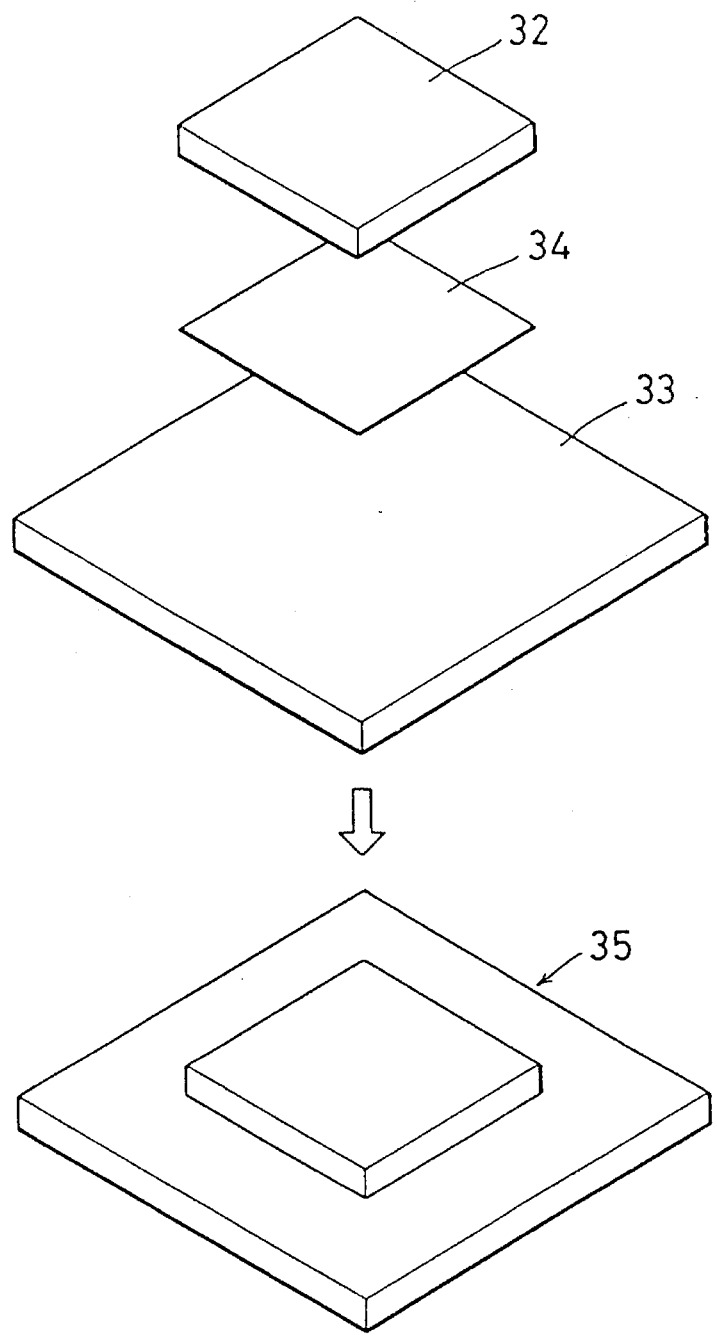
FIG. 15(A) is a flow diagram showing a process of manufacturing a prior art heat-sink base.
Figure 15B:
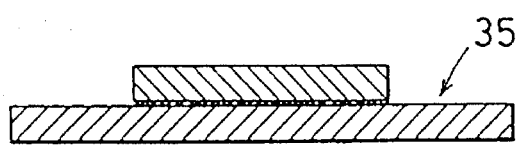
FIG. 15(B) is a sectional view of the base.
Figure 16:
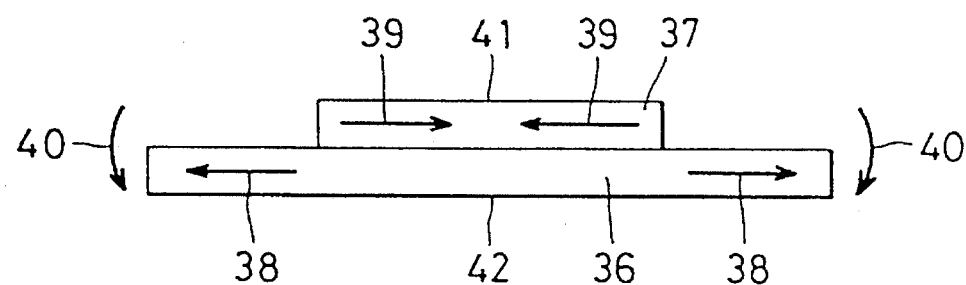
FIG. 16 is a schematic sectional view of a prior art heat-sink base.
Figure 17A:
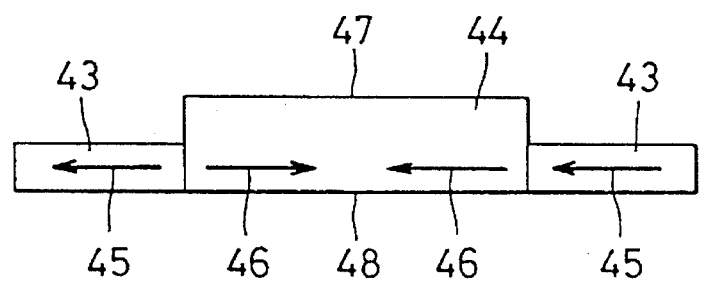
FIGS. 17(A) and 17(B) are schematic sectional views of composite heat-sink bases of the invention.
Figure 17B:
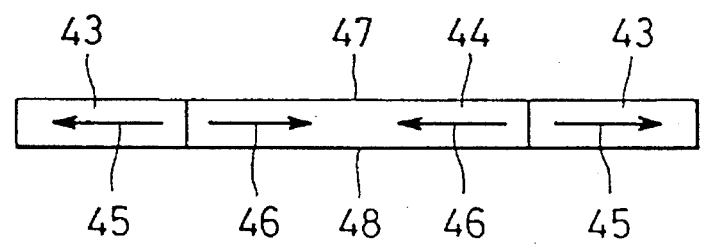
Figure 18:
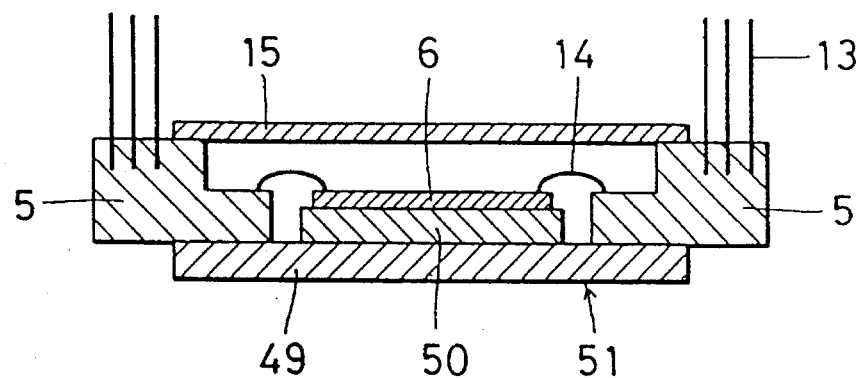
FIG. 18 is a schematic sectional view of a semiconductor mounting plastic package using a prior art heat-sink base.
Figure 19:
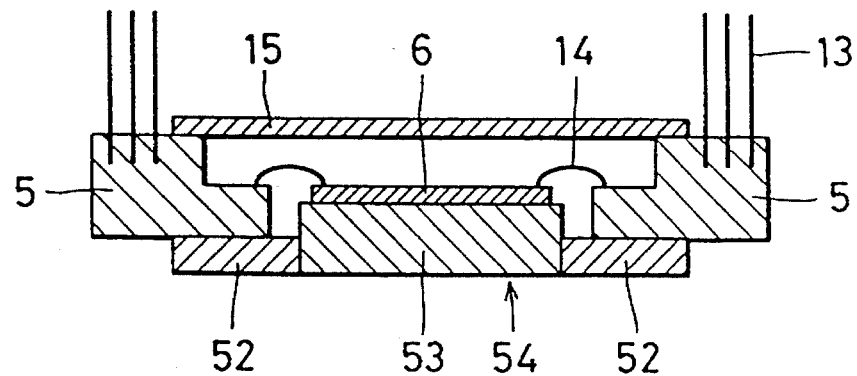
FIG. 19 is a schematic sectional view of a semiconductor mounting plastic package using a base according to the invention.
Figure 20A:
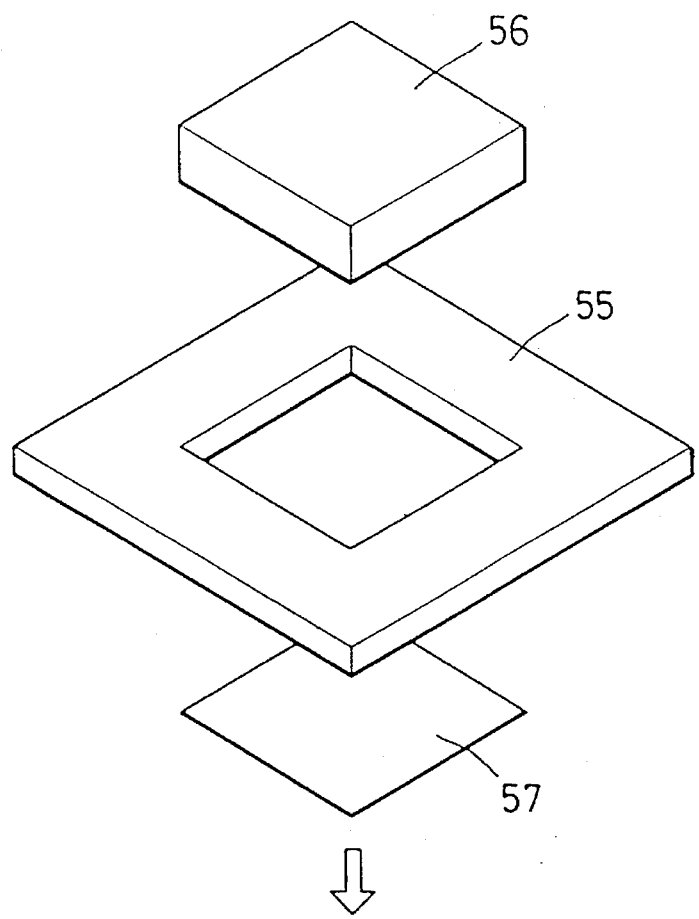
FIG. 20(A) is a flow diagram showing a process of manufacturing a composite heat sink base according to the invention.
Figure 20A:
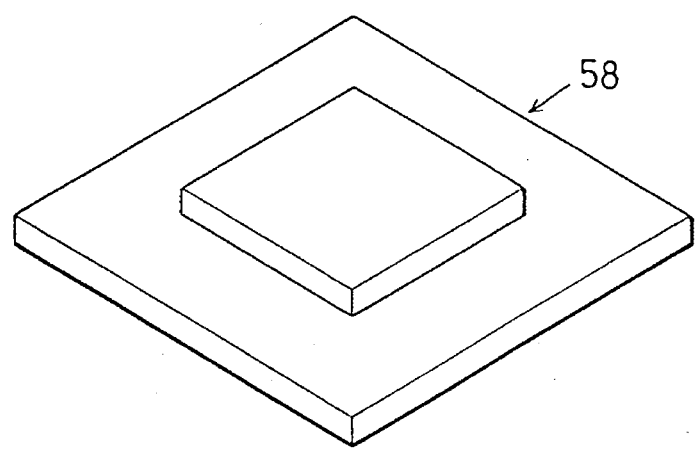
Figure 20B:
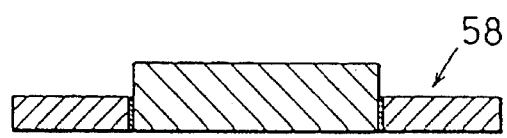
FIG. 20(B) is a sectional view of the base.

The base 18 as applied in use is shown by way of example in FIG. 9. Where the thermal expansion coefficient 13—17×$10^{-6}$ ($deg^{-1}$) of the plastic package 5 was exactly known, it was possible to bring the thermal expansion coefficient of the composite base 18 into exact agreement with that of the package. In such case, a seat-sink base having high sealing characteristics at the bond between the base and the package was obtained. The thermal expansion coefficient of the semiconductor-mounting portion or Cu—W composite alloy 1 was 6.4—9.0×$10^{-6}$ ($deg^{-1}$). Thus, the difference in thermal expansion coefficient from the semiconductor device 6 was insignificant, and the reliability of the base at its bond with the silicon device was not affected in any unfavorable way.

As above described, in the composite heat-sink base of the invention, the semiconductor mounting portion is a Cu—W or Cu—Mo portion having high thermal conductivity close to the thermal expansion coefficient of the semiconductor device, and its portion adjacent to the plastic package or flexible printed wiring board is a copper or copper alloy portion comprising Cu—W or Cu—Mo or 95 wt. % C having high thermal conductivity close to the thermal expansion coefficient of the plastic package or wiring board. These portions are integrally bonded together in a highly productive way. Thus, a heat-sink base having high bond strength, good thermal dispersibility, high hermetic sealing characteristics, and dependability in quality can be obtained. This makes it possible to provide a composite heat-sink base for use with semiconductor mounting integrated circuits which is of relatively low cost and of reliable quality.

What is claimed is:

1. An electronic component-mounting structure comprising:

a heat-sink base including an electronic component receiving member, and an attaching member integrally bonded to said electronic component receiving member;

wherein said electronic component receiving member is formed of a Cu—W or Cu—Mo composite alloy containing 5 to 25% by weight of copper and having a thermal expansion coefficient of 6.4×$10^{-6}$ $deg^{-1}$ to

TABLE 2

| | Alloy Composition (wt %) | Cu Frame Outer Diameter (mm) | Cu Frame Outer/Inner Diameter Ratio | Outer Diameter Thermal Expansion Coefficient (× $10^{-6}$ $deg^{-1}$) | Cu-W Thermal Expansion Coefficient (× $10^{-6}$ $deg^{-1}$) |
|---|---|---|---|---|---|
| 1 | 10Cu-90W | 21 | 1.3 | 11.1 | 6.4 |
| 2 | | 24 | 1.5 | 12.3 | 6.6 |
| 3 | | 27 | 1.7 | 13.3 | 6.8 |
| 4 | | 32 | 2.0 | 14.2 | 6.9 |
| 5 | | 38 | 2.4 | 15.0 | 7.1 |
| 6 | 15Cu-85W | 21 | 1.3 | 11.3 | 6.9 |
| 7 | | 24 | 1.5 | 12.5 | 7.1 |
| 8 | | 27 | 1.7 | 13.6 | 7.4 |
| 9 | | 32 | 2.0 | 14.5 | 7.5 |
| 10 | | 38 | 2.4 | 15.3 | 7.7 |
| 11 | 20Cu-80W | 21 | 1.3 | 11.7 | 8.0 |
| 12 | | 24 | 1.5 | 12.9 | 8.2 |
| 13 | | 27 | 1.7 | 14.3 | 8.7 |
| 14 | | 32 | 2.0 | 15.2 | 8.8 |
| 15 | | 38 | 2.4 | 16.0 | 9.0 |

According to Table 2, by varying the alloy composition of Cu—W composite alloy, and the inner diameter to outer diameter ratio of the copper hollow frame, it is possible to control the thermal expansion coefficient of the outer diameter portion (or whole) of the composite heat-sink substrate to any selected value.

9×$10^{-6}$ $deg^{-1}$, inclusive; and wherein said attaching member is formed of a Cu—W or Cu—Mo composite alloy containing 40 to 70% by weight of copper and having a thermal expansion coefficient of 11.1×$10^{-6}$ $deg^{-1}$ to 16×$10^{-6}$ $deg^{-1}$, inclusive.

2. An electronic component-mounting structure as recited in claim 1, wherein said attaching member comprises a hollow frame-shaped member having an opening formed through a central portion thereof;

said electronic component receiving member comprises a flat plate member; and said flat plate member is integrally bonded in said opening of said hollow frame-shaped member.

3. An electronic component-mounting structure as recited in claim 2, further comprising a substrate member having an opening formed therethrough; and wherein said attaching member of said heat-sink base is fixed to said substrate member such that said electronic component receiving member is exposed through said opening of said substrate member.

4. An electronic component-mounting structure as recited in claim 3, wherein said electronic component receiving member protrudes into said opening of said substrate member.

5. An electronic component-mounting structure as recited in claim 2, wherein said flat plate member comprises a stepped portion protruding from said central portion of said hollow frame-shaped member.

6. An electronic component-mounting structure as recited in claim 1, wherein said electronic component receiving member comprises a stepped portion protruding from a central portion of said attaching member.

7. An electronic component-mounting structure as recited in claim 1, wherein said electronic component receiving member is mounted atop said attaching member at a central portion thereof.

8. An electronic component-mounting structure as recited in claim 1, further comprising a substrate member having an opening formed therethrough; and wherein said attaching member of said heat-sink base is fixed to said substrate member such that said electronic component receiving member is exposed through said opening of said substrate member.

9. An electronic component-mounting structure as recited in claim 8, wherein said electronic component receiving member protrudes into said opening of said substrate member.

10. An electronic component-mounting structure as recited in claim 8, wherein said substrate member comprises a plastic package member.

11. An electronic component-mounting structure as recited in claim 8, wherein said substrate member comprises a printed wiring board.

12. An electronic component-mounting structure comprising:

a heat-sink base including an electronic component receiving member, and an attaching member integrally bonded to said electronic component receiving member;

wherein said electronic component receiving member is formed of a Cu—W or Cu—Mo composite alloy containing 5 to 25% by weight of copper and having a thermal expansion coefficient of $6.4 \times 10^{-6}$ $\deg^{-1}$ to $9 \times 10^{-6}$ $\deg^{-1}$, inclusive; and wherein said attaching member is formed of a copper material or copper alloy having a copper content of not less than 95% by weight and having a thermal expansion coefficient of $11.1 \times 10^{-6}$ $\deg^{-1}$ to $16 \times 10^{-6}$ $\deg^{-1}$, inclusive.

13. An electronic component-mounting structure as recited in claim 12, wherein said attaching member comprises a hollow frame-shaped member having an opening formed through a central portion thereof;

said electronic component receiving member comprises a flat plate member; and said flat plate member is integrally bonded in said opening of said hollow frame-shaped member.

14. An electronic component-mounting structure as recited in claim 13, further comprising a substrate member having an opening formed therethrough; and wherein said attaching member of said heat-sink base is fixed to said substrate member such that said electronic component receiving member is exposed through said opening of said substrate member.

15. An electronic component-mounting structure as recited in claim 14, wherein said electronic component receiving member protrudes into said opening of said substrate member.

16. An electronic component-mounting structure as recited in claim 13, wherein said flat plate member comprises a stepped portion protruding from said central portion of said hollow frame-shaped member.

17. An electronic component-mounting structure as recited in claim 12, wherein said electronic component receiving member comprises a stepped portion protruding from a central portion of said attaching member.

18. An electronic component-mounting structure as recited in claim 12, wherein said electronic component receiving member is mounted atop said attaching member at a central portion thereof.

19. An electronic component-mounting structure as recited in claim 12, further comprising a substrate member having an opening formed therethrough; and wherein said attaching member of said heat-sink base is fixed to said substrate member such that said electronic component receiving member is exposed through said opening of said substrate member.

20. An electronic component-mounting structure as recited in claim 19, wherein said electronic component receiving member protrudes into said opening of said substrate member.

21. An electronic component-mounting structure as recited in claim 19, wherein said substrate member comprises a plastic package member.

22. An electronic component-mounting structure as recited in claim 19, wherein said substrate member comprises a printed wiring board.

* * * * *